(12) United States Patent
Sekiguchi et al.

(10) Patent No.: US 6,501,672 B1
(45) Date of Patent: Dec. 31, 2002

(54) DYNAMIC RANDOM ACCESS MEMORY (DRAM) CAPABLE OF CANCELING OUT COMPLEMENTARY NOISE DEVELOPED IN PLATE ELECTRODES OF MEMORY CELL CAPACITORS

(75) Inventors: Tomonori Sekiguchi, Kokubunji (JP); Kazuhiko Kajigaya, Iruma (JP); Katsutaka Kimura, Akishima (JP); Riichiro Takemura, Tokyo (JP); Tsugio Takahashi, Hamura (JP); Yoshitaka Nakamura, Ome (JP)

(73) Assignee: Hitachi, LTD, Tokyo (JP)

( * ) Notice: Subject to any disclaimer, the term of this patent is extended or adjusted under 35 U.S.C. 154(b) by 280 days.

(21) Appl. No.: 09/656,477

(22) Filed: Sep. 6, 2000

(30) Foreign Application Priority Data

Oct. 15, 1999 (JP) .......................................... 11-294615

(51) Int. Cl.$^7$ ................................................ G11C 5/06
(52) U.S. Cl. .............................. 365/72; 365/63; 365/51; 365/190; 365/205; 365/208; 365/207; 365/230.03; 365/230.06; 365/226
(58) Field of Search ............................. 365/63, 72, 51, 365/149, 190, 203, 230.06, 226, 205, 208, 207, 206, 230.03

(56) References Cited

U.S. PATENT DOCUMENTS 4,476,547 A * 10/1984 Miyasaka .................... 365/205
4,799,197 A * 1/1989 Kodama et al. ............. 365/205
6,072,208 A * 6/2000 Nishihara ..................... 257/296

FOREIGN PATENT DOCUMENTS

| JP | 59002365 | 1/1984 | ........... H01L/27/10 |
| JP | 60195795 | 10/1985 | ........... G11C/11/34 |
| JP | 60211871 | 10/1985 | ........... H01L/27/10 |
| JP | 09135009 | 5/1997 | ......... H01L/27/115 |

* cited by examiner

Primary Examiner—Andrew Q. Tran

(57) ABSTRACT

A dynamic RAM comprising a plurality of word lines respectively connected to address select terminals of a plurality of dynamic memory cells, a plurality of complementary bit line pairs respectively connected to input/output terminals of the plurality of dynamic memory cells and placed in directions opposite to one another, and a sense amplifier array which is supplied with an operating voltage according to an operation timing signal and comprises a plurality of latch circuits for respectively amplifying the differences in voltage between the complementary bit line pairs. In the dynamic RAM, common electrodes provided, in opposing relationship to storage nodes corresponding to connecting points between address select MOSFETs and information storage capacitors of the plurality of dynamic memory cells, on both sides of the sense amplifier array are connected to one another by wiring using the common electrodes.

20 Claims, 19 Drawing Sheets

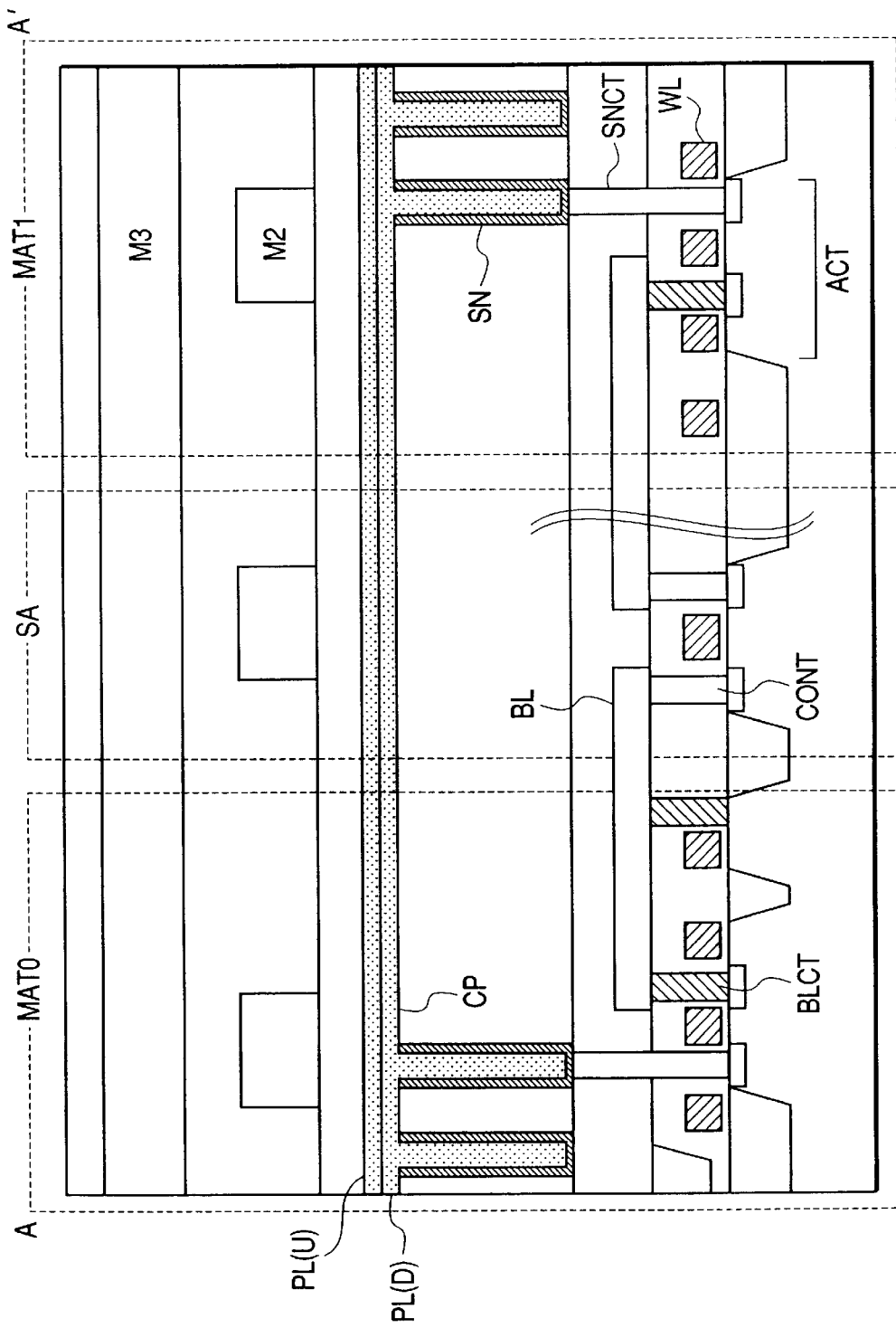

DYNAMIC RANDOM ACCESS MEMORY (DRAM) CAPABLE OF CANCELING OUT COMPLEMENTARY NOISE DEVELOPED IN PLATE ELECTRODES OF MEMORY CELL CAPACITORS

BACKGROUND OF THE INVENTION

The present invention relates to a dynamic RAM (Random Access Memory) and a semiconductor device, and to a technology effective for application to a so-called open bit line type wherein dynamic memory cells are respectively placed at points where word lines and bit lines intersect.

According to investigations subsequent to the completion of the present invention, it has been revealed that Japanese Patent Application Laid-Open No. Sho 59(1984)-2365 (hereinafter called "prior art 1"), Japanese Patent Application Laid-Open No. Sho 60(1985)195795 (hereinafter called "prior art 2"), Japanese Patent Application Laid-Open No. Sho 60(1985)-211871 (hereinafter called "prior art 3"), and Japanese Patent Application Laid-Open No. Hei 9(1997)-135009 (hereinafter called "prior art 4") have existed as those considered to. be related to the present invention to be described later.

The prior arts 1 through 3 relate to a technology which makes use of even information storage capacitors using MOS capacity and supplies a voltage to each of plate electrodes employed in an open bit line type (one-intersection type or system). In the publication of the prior art 1, first wires crossed in a direction orthogonal to each bit line and connected at plural points, second wires for interconnecting the first wires with one another, and third wires for connecting central portions of the second wires to their corresponding power or source lines are provided to achieve the uniformity of accurate potential distributions of opposite electrodes of the information storage capacitors. In the publication of the prior art 2, a resistor is provided between two plate electrodes provided with a sense amplifier interposed therebetween to thereby delay a change in the potential of each plate electrode in association with a change in substrate voltage at the time that information stored in each memory cell is read out to a bit line. In the publication of the prior art 3, a plate electrode and wires for supplying voltages thereto are formed of a metal having a high melting point and low in resistance, or silicide of the metal and silicon. Alternatively, a plurality of metal wiring layers are provided on the plate electrode.

According to the prior art 1, a problem developed due to the fact that a source voltage changed according to the operation of a peripheral circuit is not transferred to the entirety of a plate electrode, is solved by laying out voltage-supplying power or source wires at plural points of the plate electrode and uniformizing the potential of the plate electrode on the whole according to the change in potential due to the operation of the peripheral circuit. According to the prior art 2, a problem developed due to the fact that a relative potential change differs from a change in potential on the substrate side, is solved by connecting the two plate electrodes through a resistor having time constant associated with the change in potential on the substrate side. In the prior art 3 on the other hand, the problem that a change in potential supplied to each plate electrode from its corresponding bit line through a storage capacitor would lead to the application of a voltage to the plate electrode, is solved by reducing the resistance of each wire connected to the plate electrode.

SUMMARY OF THE INVENTION

It has been desirable to reduce the cost of a dynamic RAM (hereinafter called simply "DRAM"). To this end, a reduction in chip size is most effective. A scale-down has heretofore been pushed forward to reduce a memory cell size. It is however necessary to change even an operating mode or system of a memory array and thereby make a further reduction in cell size. By changing the operating mode of the memory array from a two-intersection type to a one-intersection type, the cell size can ideally be reduced to 75% by using the same design rule. However, the one-intersection type memory array has a problem in that array noise placed on each bit line or the like is high, as compared with the two-intersection type memory array. Thus, a product application becomes difficult unless it is solved.

Therefore, a discussion has been made of noise developed when the memory cells employed in the conventional two-intersection type are used as they are to configure the one-intersection type memory array. Thus, it has been revealed that an unnegligible parasitic capacity has existed between each bit line and the plate electrode when the memory cell is a COB (Capacitor over Bit-line) cell, so-called deep hole STC (such cylinder shape that a lower electrode SN of each capacitor is formed on an inner wall of a hole defined in an interlayer dielectric) except for the MOS capacity. Even if the techniques described in the prior arts 1 to 3 are used as they are to perform the supply of a voltage, it has been found out that the array noise placed on the bit line, could not be reduced.

A description will be made of degradation in operating margin for each memory array due to plate noise by reference to FIGS. 16A and 16B. In the worst case of a one-intersection memory array shown in FIG. 16A, bit lines in a selected mat are all amplified to a low level (L) except for one bit line according to an amplifying operation of each sense amplifier, and bit lines in a non-selected mat are all amplified to a high level (H) except for one bit line. At this time, there is a danger that only one bit line in the selected mat, on which a high-level (H) signal appears, is subjected to noise from a plate electrode, whereby the signal would be amplified erroneously.

Now consider, as one example, where a word line WL0 is activated so that a high-level (H) signal appears on a bit line BL1T alone and a low-level (L) signal is read out onto other bit lines BL0T and BL2T and the like. Further, the high-level (H) signal developed on the bit line BL1T is regarded as small due to the reason such as the leakage or the like of an electrical charge for holding information in each memory cell. When a sense amplifier is activated, such bit lines BL0T/B, BL2T/B, etc. that signals greatly appear between complementary bit lines, are amplified fast in signal.

On the other hand, a bit line BL1T/B small in signal is slow in amplifying rate. At this time, negative noise is developed in a plate electrode PL0 of a selected mat from the bit lines BL0T, BL2T, etc. through a parasitic capacity CBLSN and a memory cell capacitor CS between storage nodes SN. To the contrary, positive noise is produced in a plate electrode PL1 of a mat adjacent thereto from bit lines BL0B and BL2B, etc. When these noise are returned from the plate electrode PL1 to the bit line BL1T/B on which a reverse signal appears, through the capacitor CS and the parasitic capacity CBLSN, a signal amount decreases so that the bit line is reversed erroneously.

Thus, the open bit line type memory array referred to above gets into great danger that information is erroneously read when the amount of a signal charge stored in each memory cell decreases. This leads to degradation in refresh characteristic and can result in a great reduction in yield of a DRAM. While the above description has been made with the noise developed in each plate electrode as an example, there is a fear of noise having a similar mechanism being produced even in a non-selected word line WL and a substrate for each memory cell. These noise degrade a read margin for the memory array.

An object of the present invention is to provide an open bit line type dynamic RAM and a semiconductor device capable of improving an operating margin. Another object of the present invention is to provide a dynamic RAM and a semiconductor device capable of achieving high integration and the stabilization of their operations. The above, and other objects and novel features of the present invention will become apparent from the description of the present specification and the accompanying drawings.

A summary of a typical one of the inventions disclosed in the present application will be described briefly as follows: In a dynamic RAM comprising a plurality of word lines respectively connected to address select terminals of a plurality of dynamic memory cells, a plurality of complementary bit line pairs respectively connected to input/output terminals of the plurality of dynamic memory cells and placed in directions opposite to one another, and a sense amplifier array which is supplied with an operating voltage according to an operation timing signal and comprises a plurality of latch circuits for respectively amplifying the differences in voltage between the complementary bit line pairs, common electrodes provided in opposing relationship to storage nodes corresponding to connecting points between address select MOSFETs and information storage capacitors of the plurality of dynamic memory cells provided on both sides with the sense amplifier array as the center are connected to one another while circuit connections in the sense amplifier array are being ensured by wiring means using the common electrodes.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 2A and 2B are respectively explanatory views illustrating a memory cell of a dynamic RAM according to the present invention;

DETAILED DESCRIPTION OF THE PREFERRED EMBODIMENTS

Preferred embodiments of the present invention will hereinafter be described in detail with reference to the accompanying drawings.

Figure 14:
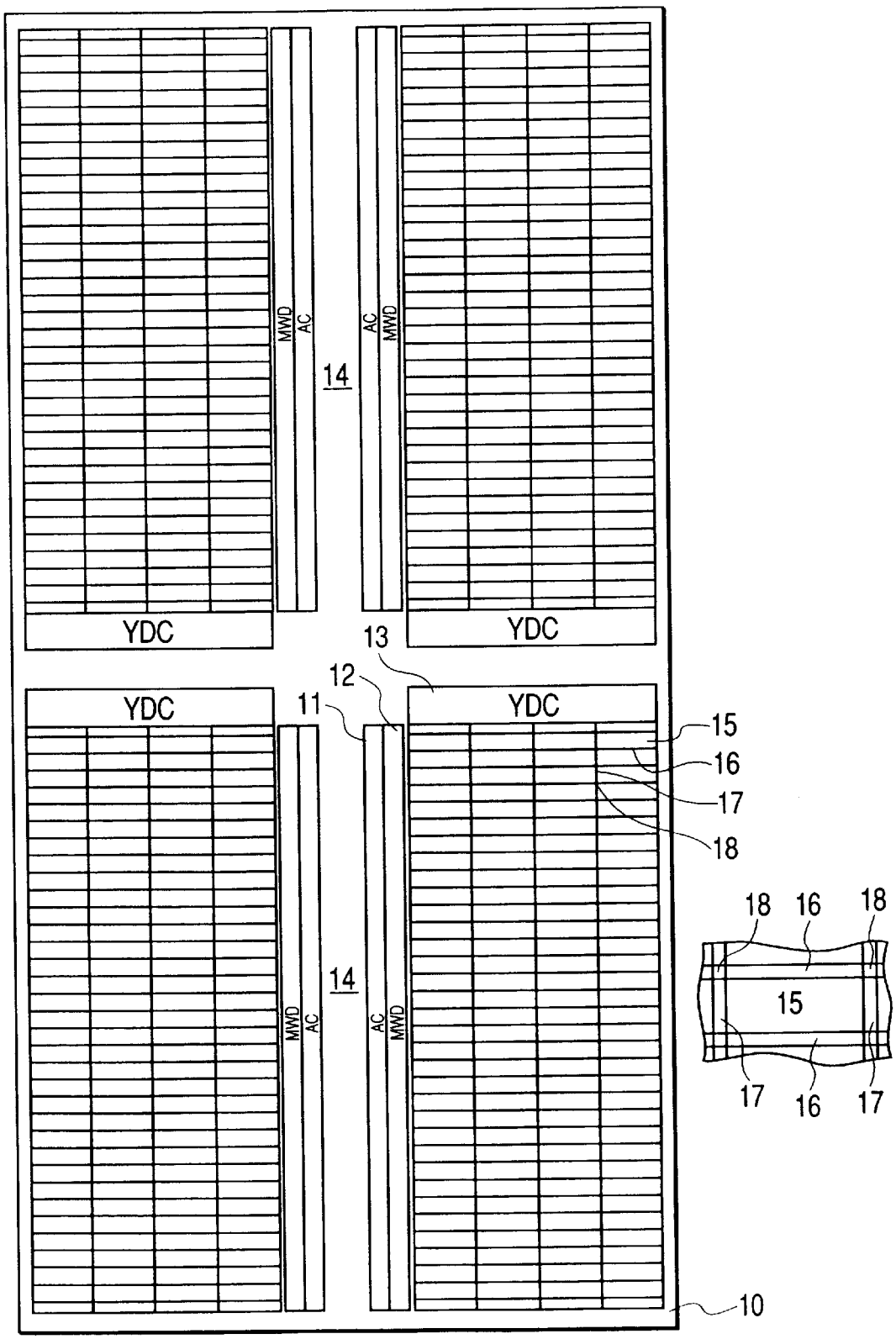
FIG. 14 is a schematic layout diagram depicting one embodiment of a dynamic RAM to which the present invention is applied.

FIG. 14 schematically shows the layout of one embodiment of a dynamic RAM to which the present invention is applied. Of respective circuit blocks constituting the dynamic RAM to which the present invention is applied, a principal portion related to the invention is shown in the same drawing as is understood therefrom. It is formed on a single semiconductor substrate like monocrystal silicon by the known manufacturing technology of semiconductor integrated circuit.

In the present embodiment, memory arrays are divided into four although not restricted in particular. An address input circuit, a data input/output circuit, an input/output interface circuit comprising a row of bonding pads, and a power circuit including a step-down and a de-boosting circuit, etc. are provided in central portions 14 being divided into the left and right with respect to the longitudinal direction of a semiconductor chip. Memory array controllers (AC) 11 and main word drivers (MWD) 12 are respectively placed in portions contiguous to the memory arrays located on both sides of these central portions 14. Each of the memory array controllers 11 comprises a control circuit for driving a sub word select line and a sense amplifier, and a main amplifier. Individual memory arrays are divided into two on both sides and two up and down with respect to the longitudinal direction of the semiconductor chip as described above, column decoder areas (YDC) 13 are provided in upper and lower central portions with respect to the longitudinal direction of the semiconductor chip.

In each memory array referred to above, the main word driver area 12 produces a signal for selecting a main word line which extends so as to penetrate one memory array corresponding to it. Sub-word select line drivers for sub-word selection are also provided in the main word driver areas 12. As will be described later, each sub-word select line driver extends in parallel to the main word line and produces a signal for selecting a sub-word select line. The column decoder 13 produces a signal for selecting a column select line extended so as to penetrate one memory array corresponding to it.

Each of the memory arrays is divided into a plurality of memory cell arrays (hereinafter called "sub arrays") 15. The sub array 15 is formed so as to be surrounded by sense amplifier areas 16 and sub-word driver areas 17 as illustrated by its enlarged view. Portions where the sense amplifier areas 16 and the sub-word driver areas 17 intersect respectively, are called intersecting areas (cross areas) 18. A sense amplifier provided for the sense amplifier area 16 comprises a latch circuit having a CMOS configuration and is defined as a so-called one intersection system or open bit line system which amplifies signals on complementary bit lines extended to both sides of each sense amplifier with the sense amplifier as the center.

Although not restricted in particular, one memory cell array (sub array) 15 shown as the enlarged view comprises 512 sub-word lines and ones (or data lines) of complementary bit lines orthogonal thereto, which are provided as 1024 lines. Since the sub arrays 15 in each memory array referred to above are provided thirty two for normal purpose in a bit line direction and provided two for reference purpose in the bit line direction as viewed in a bit-line extending direction. Since the sub arrays 15 are provided with one pairs of complementary bit lines with the sense amplifiers 16 as the centers, the bit lines are substantially divided into 16 by the sub arrays 15 as viewed in the bit-line extending directions. Further, the sub arrays 15 are provided four in a word-line extending direction. Thus, the sub-word lines are divided into four by the sub arrays 15 as viewed in the word-line extending direction.

Since the 1024 bit lines are provided for each sub array 15, memory cells corresponding to about 4K are connected in a word line direction. Since the 512 sub-word lines are provided, memory cells corresponding to 512×32=16K are connected in the bit-line direction. Thus, one memory array has a storage capacity of 4K×16K=64 Mbits, and the four memory arrays have a storage capacity of 4×64M=256 Mbits as the whole of a memory chip 10.

In the present application, the term "MOS" is understood as a metal oxide semiconductor configuration originally called for simplicity or brevity. However, the recent generally-named MOSs include those obtained by changing a metal of essential portions of a semiconductor device to an electrical conductor such as polysilicon which does not belong to the metal and changing oxide to another insulator. Also CMOSs are now understood as having a wide technical meaning corresponding to a change in how to grasp the MOSs referred to above. MOSFETs are also similarly taken as the meaning including such a wide construction as substantially taken as an insulated-gate field effect transistor without being understood in a narrow sense. CMOSs, MOSFETs, etc. employed in the present invention follow general naming and include even transistors.

Figure 1A:
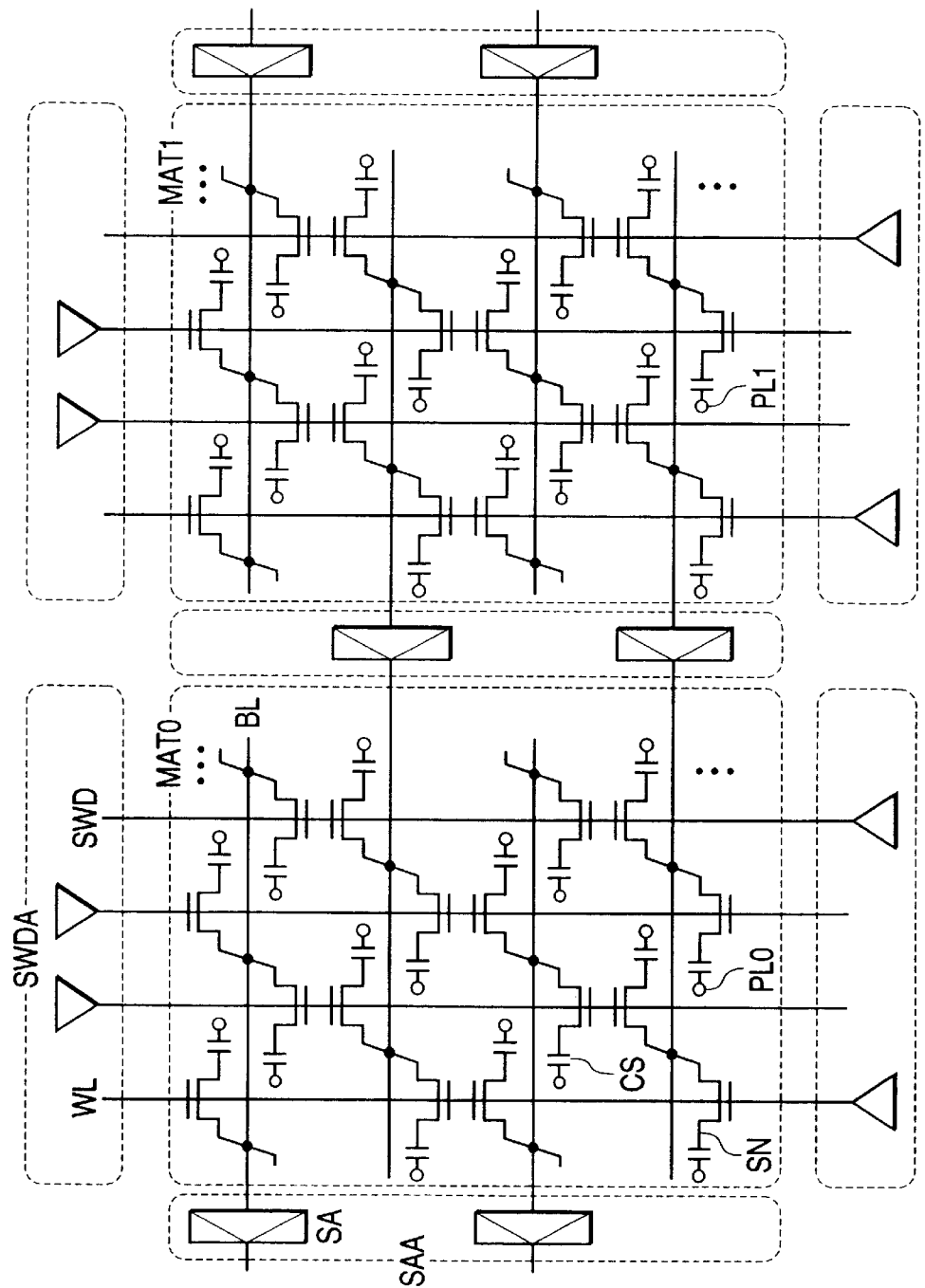
FIGS. 1A and 1B are respectively configurational views showing one embodiment of a dynamic RAM according to the present invention.
Figure 1B:
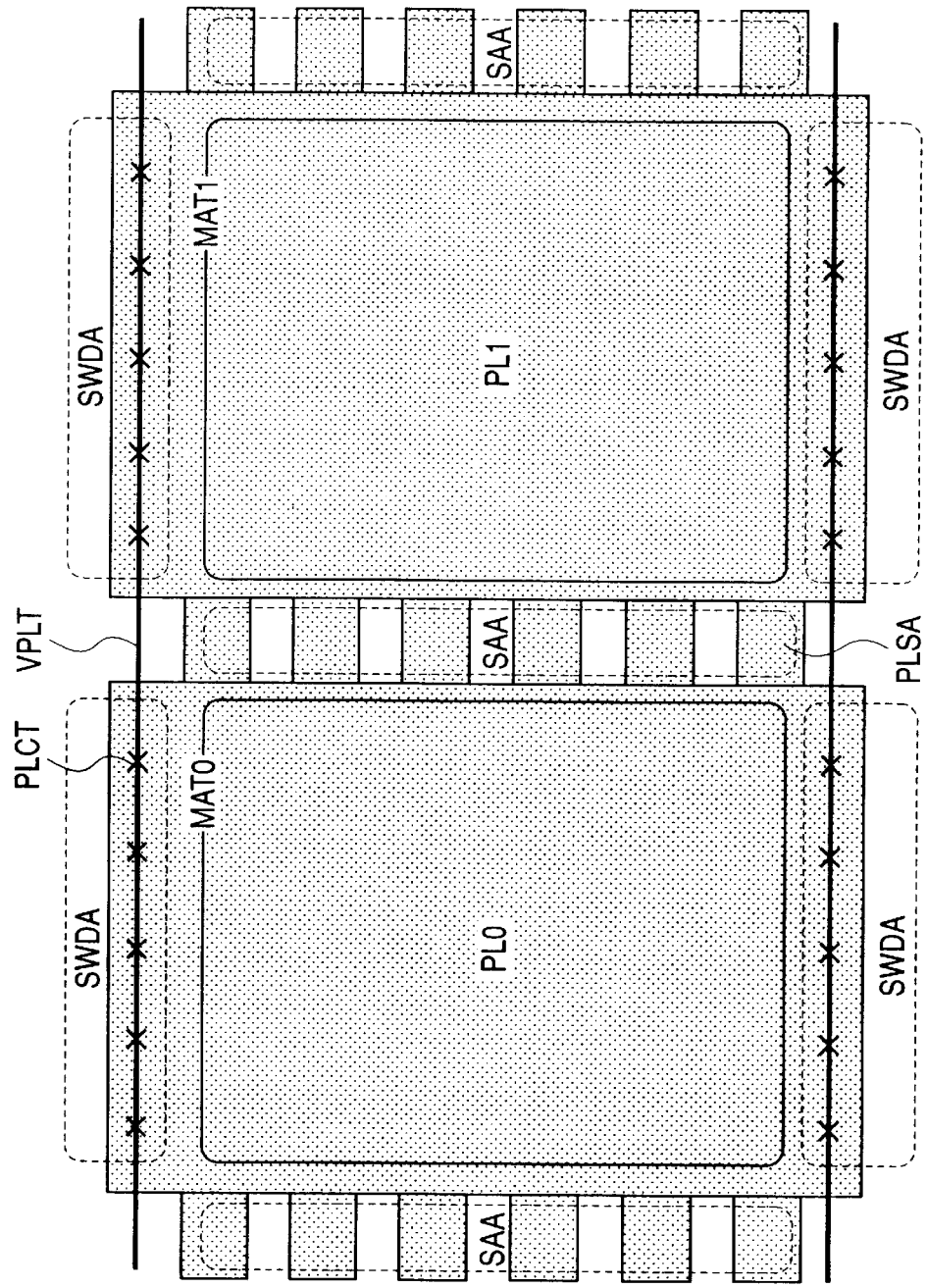

FIGS. 1A and 1B are respectively configurational views of one embodiment for describing the dynamic RAM according to the present invention. FIG. 1A shows circuits associated with two sub arrays (or memory mats) MAT0 and MAT1 provided in the dynamic RAM of the hierarchical word-line system, and FIG. 1B shows layouts corresponding thereto. In FIG. 1B, memory cells MCs each comprising MOSFET and a cell capacitor or capacitance CS are respectively connected to all points where bit lines BL and sub-word lines WL intersect. Each sense amplifier SA is connected to the bit lines, whereas sub-word drivers SWD are connected to the word lines WL.

In the present embodiment, the eight sub-word lines are arranged for each main word line in a complementary bit-line direction to decrease the number of the main word lines, in other words, reduce the wiring pitch of each main word line as will be described later, although not restricted in particular. A sub-word selection driver is provided to select one sub-word line from the sub-word lines divided into four in the main word-line direction and assigned in the complementary bit-line direction by eight as shown in FIG. 14. This sub-word selection driver produces a signal for selecting one from the eight sub-word select lines which extend in the direction of an arrangement of the sub-word drivers (sub-word driver arrays SWDA). Although not shown in the drawing, the main word lines MWL are extended in parallel to the sub-word lines WL. Although not shown in the drawing, each column selection line YS is disposed in parallel to the direction of extension of each bit line BL orthogonal thereto.

The sense amplifiers SA of a sense amplifier array SAA provided between the two sub arrays MAT0 and MAT1 are connected to their corresponding complementary bit lines such as to extend to both sides of the two sub arrays MAT0 and MAT1. As to these sense amplifiers SA, one sense amplifier SA is arranged every two bit lines in the sense amplifier array SAA. Thus, the sense amplifier array SAA provided between the two sub arrays MAT0 and MAT1 is provided with 512 sense amplifiers SA corresponding to half of the 1024 bit lines where the 1024 bit lines exist.

In the sub array MAT0, the remaining 512 bit lines are connected to their corresponding sense amplifiers SA provided in a sense amplifier array SAA on the side opposite to the memory mat MAT1. In the sub array MAT1, the remaining 512 bit lines are connected to their corresponding sense amplifiers SA provided in a sense amplifier array SAA provided on the side opposite to the sub array MAT0. Since one sense amplifier may be formed every two bit lines according to the dispersed placement or layout of such sense amplifiers SA on both sides as viewed in the bit-line direction, the sub arrays and the sense amplifier arrays can be formed with high density so as to cause the pitches of the sense amplifier SA and the bit line BL to coincide with each other.

This is similar even to the sub-word drivers SWD. 512 sub-word lines WL provided in the sub array MAT0 are divided 256 by 256, which in turn are connected to their corresponding 256 sub-word drivers SWD of the sub-word driver arrays SWDA placed on both sides of the sub array MAT0. In the present embodiment, the sub-word drivers SWD provided two by two are dispersively placed with two sub-word lines WL as each pair. Namely, two sub-word drivers are placed on the one-end side (on the upper side in the drawing) of the sub array MAT0 with the sub-word lines corresponding to two memory cells which share the use of a portion connected to each bit line, as one pair, whereas two sub-word drivers are placed on the other end side (on the lower side in the drawing) of the sub array MAT0 with the similar two sub-word lines adjacent thereto as one pair.

Although not shown in the drawing, the sub-word drivers SWD produce signals for selecting sub-word lines for sub arrays provided on both sides with the sub-word driver array SWDA in which the sub-word drivers are formed, interposed therebetween. Thus, the sub-word drivers SWD can be dispersively placed with satisfactory efficiency in association with the sub-word lines each formed so as to coincide with an array pitch of each memory cell, and the operation of selecting each sub-word line WL can be carried out at high speed.

The memory cells MC are respectively formed at points where the bit lines BL and sub-word lines WL included in the memory arrays (or memory mats) MAT0 and MAT1 or the like surrounded by the sub-word driver arrays SWDA and sense amplifier arrays SAA. In the sub array MAT0 with the memory cells MC formed therein, upper electrodes (plate electrodes) PL of storage capacitors CS are formed in common between all the memory cells MC in the sub arrays MAT0 and MAT1 as plane electrodes as shown in FIG. 1B. The supply of power to the plate electrodes PL is carried out at the boundary between the sub-word driver array SWDA and each of the sub arrays MAT0 and MAT1 through a connecting portion PLCT from a power wire VPLT wired in the direction of extension of each bit line BL. In the same drawing, storage nodes SN are respectively lower electrodes of the storage capacitors CS and indicate portions for connection to address selection MOSFETs.

In the present embodiment, the plate electrodes PL0 and PL1 respectively formed in the sub arrays MAT0 and MAT1 provided on both sides of each sense amplifier array SAA are connected to one another by wires PLSA using a plate layer itself. Further, the wires PLSA are provided in plural form so as to penetrate the sense amplifier arrays SAA, thereby greatly reducing resistance between the two plate electrodes PL0 and PL1. Thus, phase-reversal noise developed in the plate electrodes PL0 and PL1 when a small signal read from each memory cell MC selected between complementary bit lines BL for the sub arrays MAT0 and MAT1 is amplified by the corresponding sense amplifier SA, can be cancelled out at high speed, thereby making it possible to greatly reduce the noise produced in the plate electrodes PL0 and PL1.

Figure 16A:
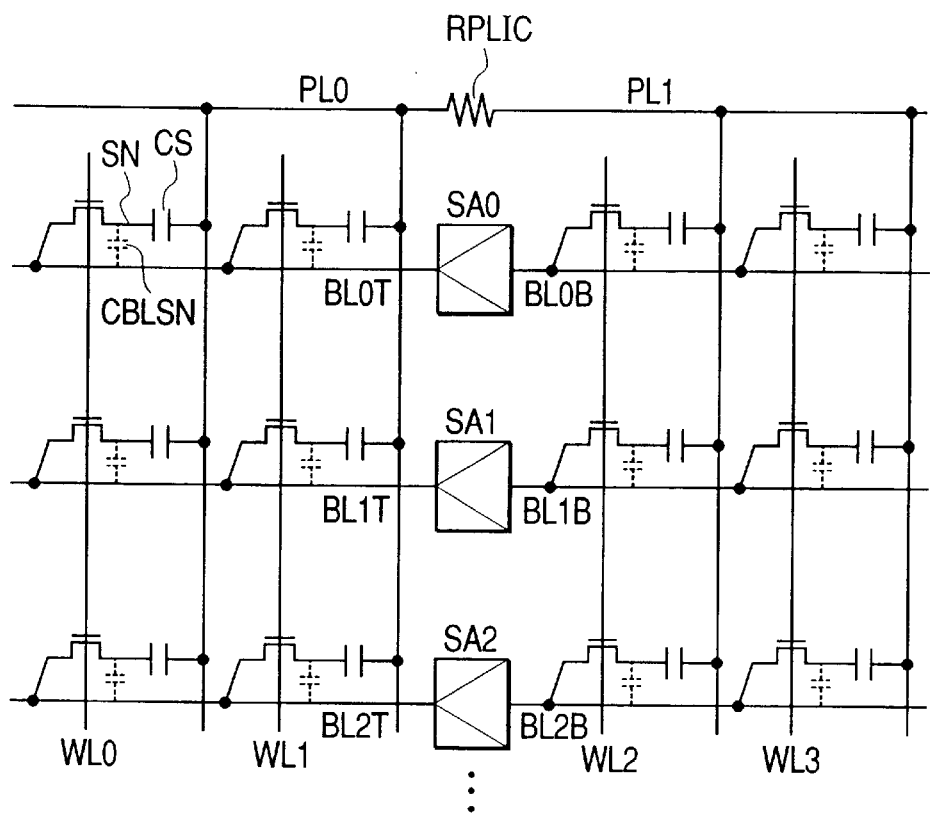
FIGS. 16A and 16B are respectively diagrams for describing one-intersection type memory array discussed by the inventors of the present application and noise produced therein.
Figure 16B:
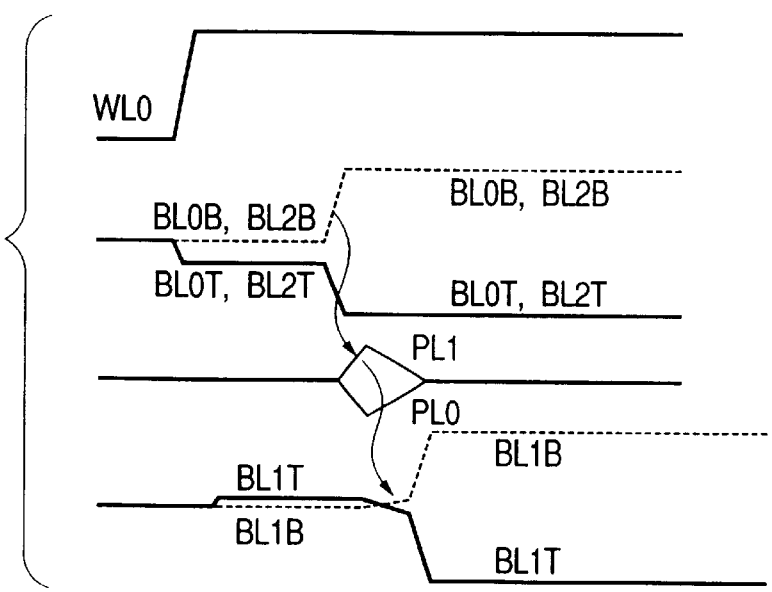

Since the noise returned to the bit line BL through the parasitic capacitor CBLSN or the like between each of the plate electrodes PL0 and PL1 and each bit line BL described in FIG. 16 is reduced owing to the reduction in the noise developed in the plate electrodes PL0 and PL1 upon the above amplifying operation of the sense amplifier SA, the sense amplifier SA is capable of sensing even a smaller signal. Namely, it is possible to greatly enlarge an operation margin for each one-intersection DRAM array.

Figure 2A:
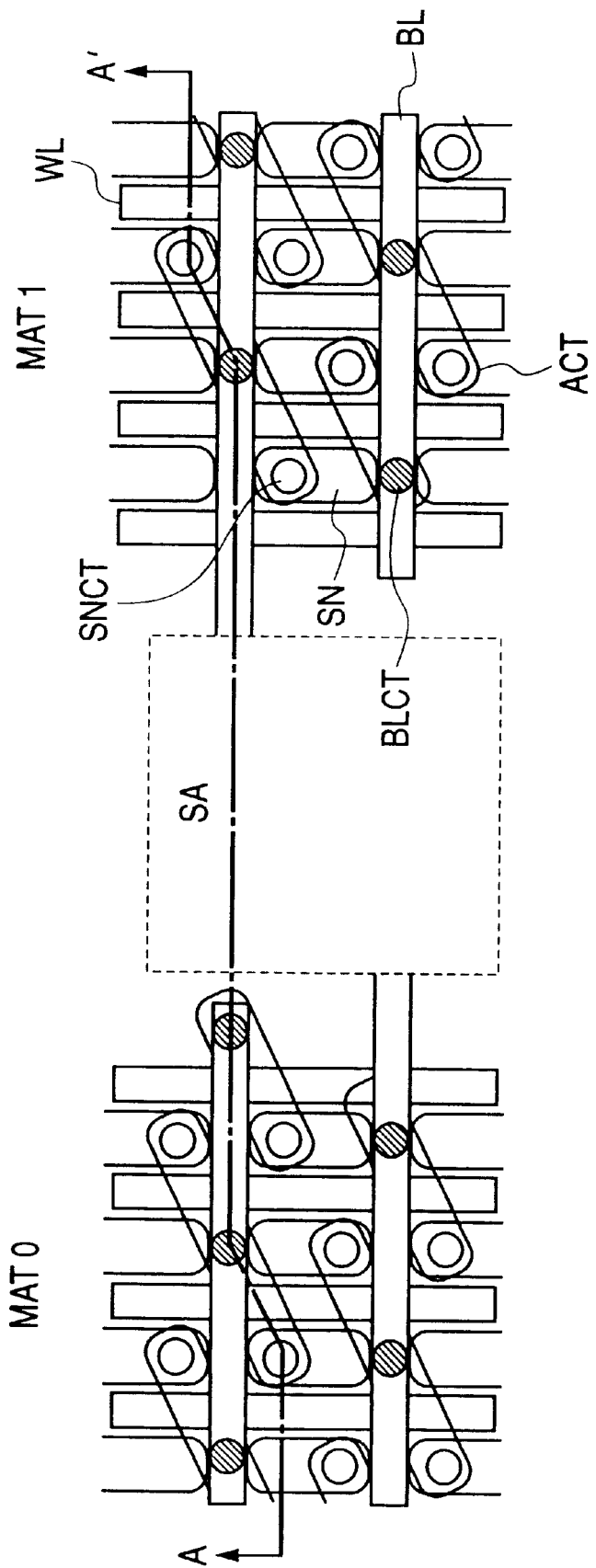

A diagram for describing one embodiment of a memory cell employed in a dynamic RAM according to the present invention is shown in FIG. 2. FIG. 2A shows the layout of memory cell arrays in two sub arrays MAT0 and MAT1, and FIG. 2B shows an element or device sectional structure of a portion taken along line A–A' of FIG. 2A, respectively. In the same drawings, the layout and cross-section of a sense amplifier SA area provided between the MAT0 and MAT1 are omitted.

ACT indicates an active region of each MOSFET, SNCT indicates a contact (connecting portion) for connecting a storage node SN of each memory cell and source and drain diffusion layers corresponding to the storage node SN, of the MOSFET formed in the active region ACT to each other, and BLCT indicates a contact (connecting portion) for connecting the corresponding bit line BL and source and drain diffusion layers, corresponding to an input/output terminal of each memory cell corresponding to the bit line BL, of the MOSFET formed in the active region ACT to each other. CP indicates a capacitance insulating film of a storage capacitor. Here, a metal layer M1 corresponding to a first layer, and each bit line BL comprises the same wiring layer. Further, a polysilicon layer FG corresponding to a first layer, and each sub-word line WL are also comprised of the same wiring layer.

As shown in FIG. 2B, plate electrodes PL for the sub arrays MAT0 and MAT1 provided on both sides of the SA are connected using electrodes themselves constituting the plate electrodes PL without turning off them on the sense amplifier SA, whereby the resistance between the plate electrode PL of the sub array MAT0 and the plate electrode PL of the sub array MAT1 can greatly be reduced. The memory cell makes use of a COB (capacitor over Bitline) structure. Namely, the storage nodes SN are provided over the bit lines BL. Thus, since the plate electrodes PL can be formed in one flat form without being cut by the bit lines BL and the connecting portions BLCT of the address selection MOSFETs within the sub arrays MATs, the resistance between the plate electrodes PL can be reduced.

Since the bit line BL exists on the plate electrode PL when a CUB (Capacitor under Bitline) structure is adopted contrary to the present embodiment, it is necessary to define holes in the plate electrodes PL within each sub array MAT and bring such connecting portions BLCT to the active regions ACT for purpose of connecting each bit line BL and the source and drain of the address selection MOSFET. Therefore, the value of the resistance of the PL increases.

The present embodiment has an advantage in that as shown in FIG. 2B, the plate electrode PL takes a laminated structure using PL(D) and PL(U), and the sheet resistance value of such plate electrode PL can be lowered. Now consider where a high dielectric film such as BST or $Ta_2O_5$ is used for the capacitive insulating film CP of the storage capacitor as one example. When Ru is used for the lower electrode (storage node) SN and upper-electrode lower layer PL(D) in this case, the capacity of the storage capacitor CS can be increased. Since Ru is low in sheet resistance value as compared with the conventionally used poly Si, the resistance value of each plate electrode PL can be reduced.

Further, if W is stacked on this structure as the plate electrode PL(U), then the resistance value of each plate electrode PL can further be reduced. When the resistance value of the plate electrode itself is reduced in this way, the speed of canceling out noise lying on the plate electrodes PL is made fast and hence the noise developed in the plate electrodes PL can be reduced. Further, TiN may be used as the plate electrode PL(D). Even in this case, an advantageous effect similar to the above can be obtained.

In the above-described structure of memory cell as is apparent from the layout of FIG. 2A, the connecting portion SNCT for connecting each storage node SN and the source and drain diffusion layers of each MOSFET is provided adjacent to each of the bit lines BL. Namely, the parasitic capacity exists between the storage node of the memory cell and the bit line BL as viewed in the vertical direction of a cross-section of the structure. Since the parasitic capacity constitutes the parasitic capacitance CBLSN shown in FIG. 16, the interconnection of the plate electrodes employed in the present invention by the wires using themselves becomes useful.

Figure 3:
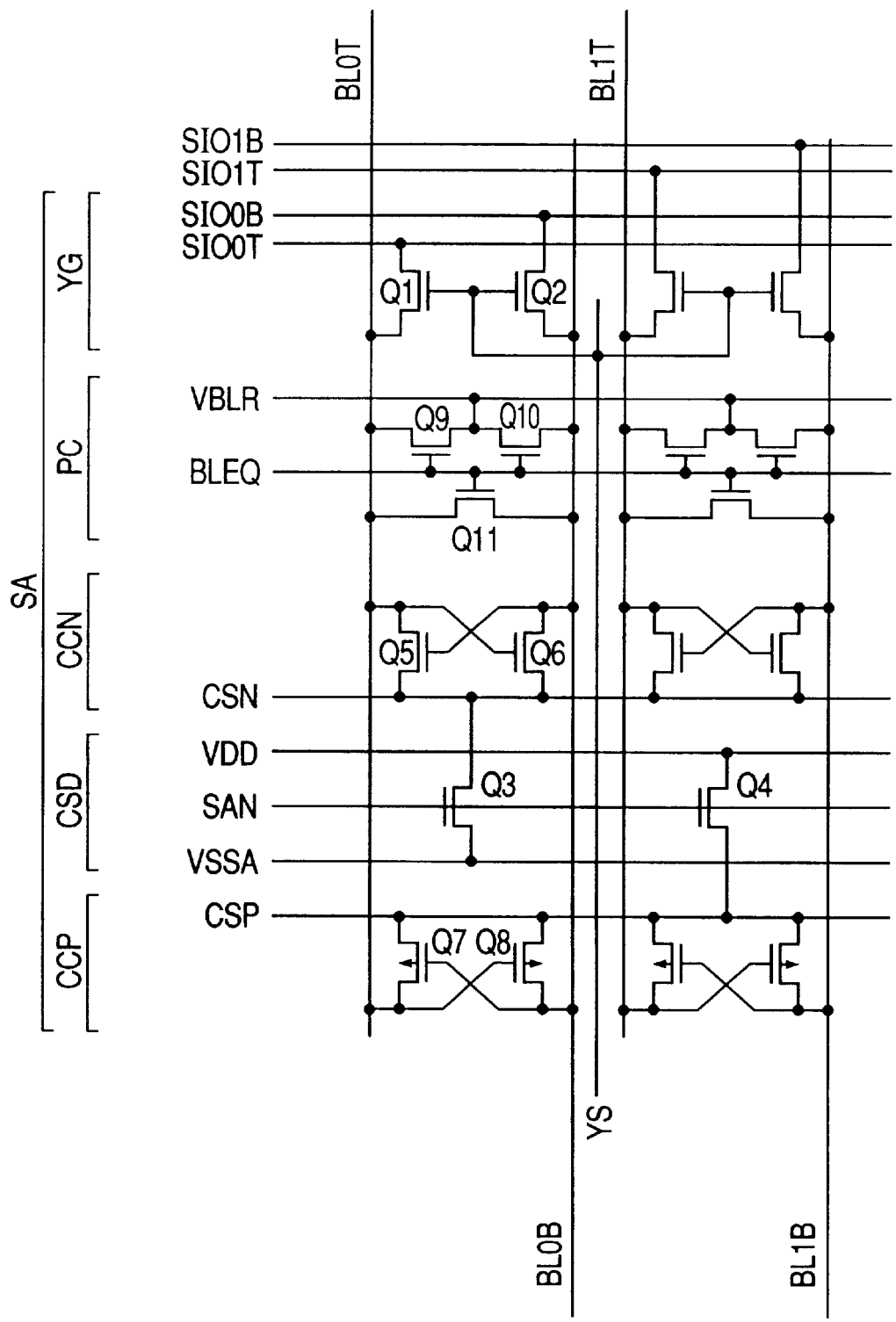
FIG. 3 is a circuit diagram depicting one embodiment of a sense amplifier unit of the dynamic RAM according to the present invention.

FIG. 3 is a circuit diagram showing one embodiment of a sense amplifier unit of the dynamic RAM according to the present invention. A sense amplifier SA comprises a CMOS latch circuit comprising N channel amplifying MOSFETs Q5 and Q6 and P channel amplifying MOSFETs Q7 and Q8 whose gates and drains are cross-connected and brought to latch form. The sources of the N channel MOSFETs Q5 and Q6 are electrically connected to a common source line CSN. The sources of the P channel MOSFETs Q7 and Q8 are electrically connected to a common source line CSP.

Power switches MOSFETs Q3 and Q4 are respectively electrically connected to the common source lines CSN and CSP. Although not restricted in particular, a ground potential supply line VSSA is given or offered to the common source line CSN to which the sources of the N channel amplifying MOSFETs Q5 and Q6 are electrically connected, by the N channel power switch MOSFET Q3 dispersively laid out in such a sense amplifier area. The common source line CSP to which the sources of the P channel amplifying MOSFETs Q7 and Q8 are electrically connected, is provided with the N. channel power MOSFET Q4 to supply an operating voltage VDD thereto.

The gates of the N channel power MOSFETs Q3 and Q4 are supplied with a sense amplifier activation signal SAN. Although not restricted in particular, the high level of the SAN is defined as a signal having a boosted voltage VPP level. Namely, the boosted voltage VPP is one boosted to greater than or equal to a threshold voltage of the MOSFET Q4 with respect to a source voltage VDD. This voltage VPP sufficiently brings the N channel MOSFET Q4 to an ON state, thereby making it possible to set the potential of the common source line CSP to the source voltage VDD.

A precharge (equalize) circuit comprising an equalize MOSFET Q11 for short-circuiting complementary bit lines BL0T and BL0B, and switch MOSFETs Q9 and Q10 for respectively supplying a half precharge voltage VBLR to the complementary bit lines BL0T and BL0B is provided at input/output nodes of the sense amplifier SA. The gates of these MOSFETs Q9 through Q11 are supplied with a pre-charge (bit-line equalize) signal BLEQ in common. As to a driver circuit for forming or producing the precharge signal BLEQ, although not shown in the drawing, an inverter circuit is provided in each cross area 18 shown in FIG. 14 to make the rising edge and falling edge of the precharge signal BLEQ fast. Namely, the driver circuit is one which performs, at high speed, switching between the MOSFETs Q9 through Q11 constituting the precharge circuit through the inverter circuits dispersively provided in each individual cross areas 18, prior to word-line selecting timing upon commencement of a memory access.

The pair of input/output nodes of the sense amplifier SA is electrically connected to local (sub) input/output lines SIO, SIO0T and SIO0B extended along a sense amplifier array through a column (Y) switch circuit comprising MOSFETs Q2 and Q3 as well as to the complementary bit lines BL0T and BL0B. The gates of the MOSFETs Q1 and Q2 are electrically connected to a column selection line YS. When the present column selection line YS is brought to a selection level (high level), they are turned ON to electrically connect the input/output nodes of the sense amplifier SA and the local input/output lines SIO0T and SIO0B to one another. Adjacent bit lines are also electrically connected to local input/output lines SIO1T and SIO1B through a switch circuit similar to the above, which is switch-controlled by the same column selection line YS.

Thus, the input/output nodes of the sense amplifier SA amplify a small voltage change with respect to a half precharge voltage on each bit line, which changes according to an electrical charge stored in each memory cell electrically connected to a point intersecting a word line of a sub array selected from two sub arrays (e.g., MAT0 and MAT1) provided with the input/output nodes interposed therebetween while a half precharge voltage on each bit line on the non-selected sub array side is being used as a reference voltage. One selected by the column selection line YS is transferred to the local input/output lines SIO0T and SIO0B, and SIO1T and SIO1B through the column switch circuit (Q1 and Q2).

As shown in FIG. 14, the local input/output lines SIO0T and SIO0B, and SIO1T and SI01B extend over the sense amplifier arrays aligned along the extension direction of the main word lines. Signals amplified through sub amplifier circuits are transferred to main amplifiers provided in main word driver MWD units through main input/output lines each extended in the direction identical thereto. In one memory array obtained by dividing the memory chip into four on the memory chip, for example, the signals are outputted in parallel in 16-bit units according to the number of divisions of the sub array. The memory arrays divided into four respectively constitute memory banks as will be described later.

Figure 4:
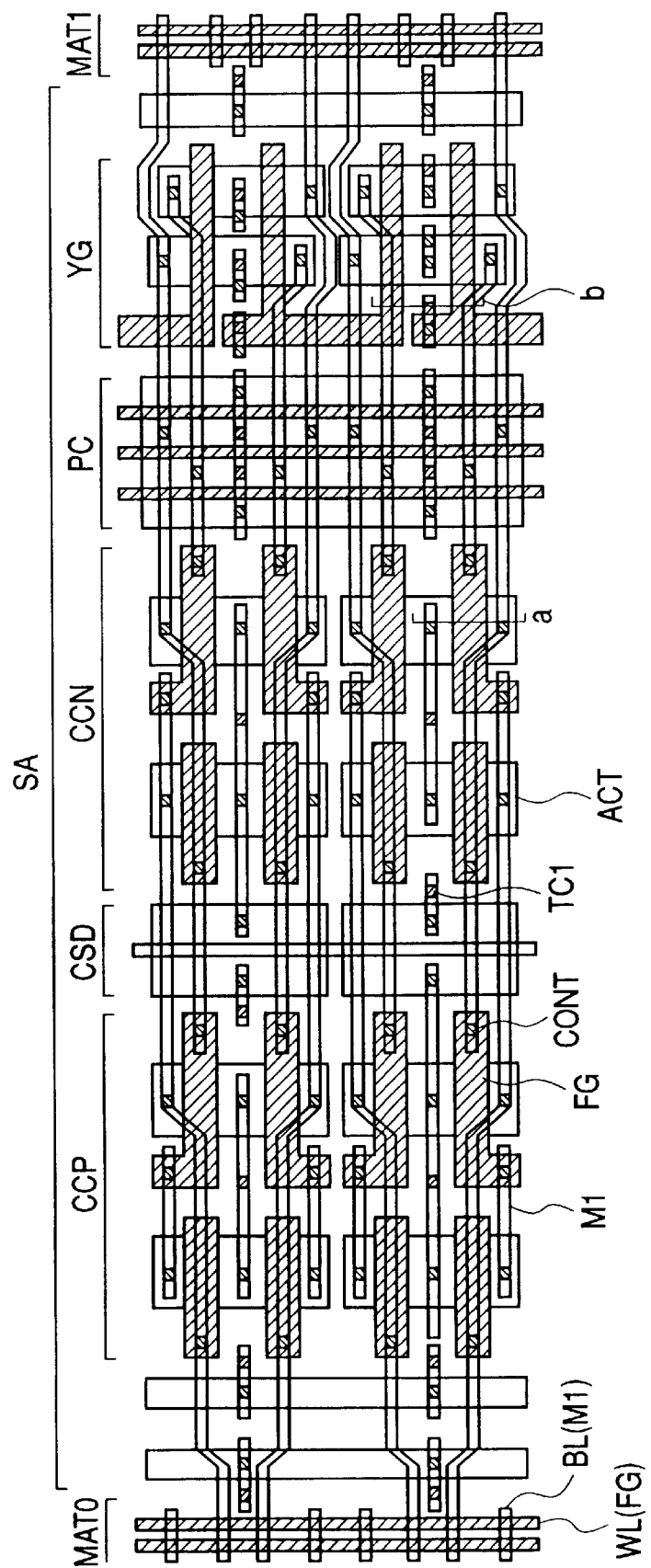
FIG. 4 is a layout diagram of a lower layer showing one embodiment of the sense amplifier unit of the dynamic RAM according to the present invention.
Figure 5:
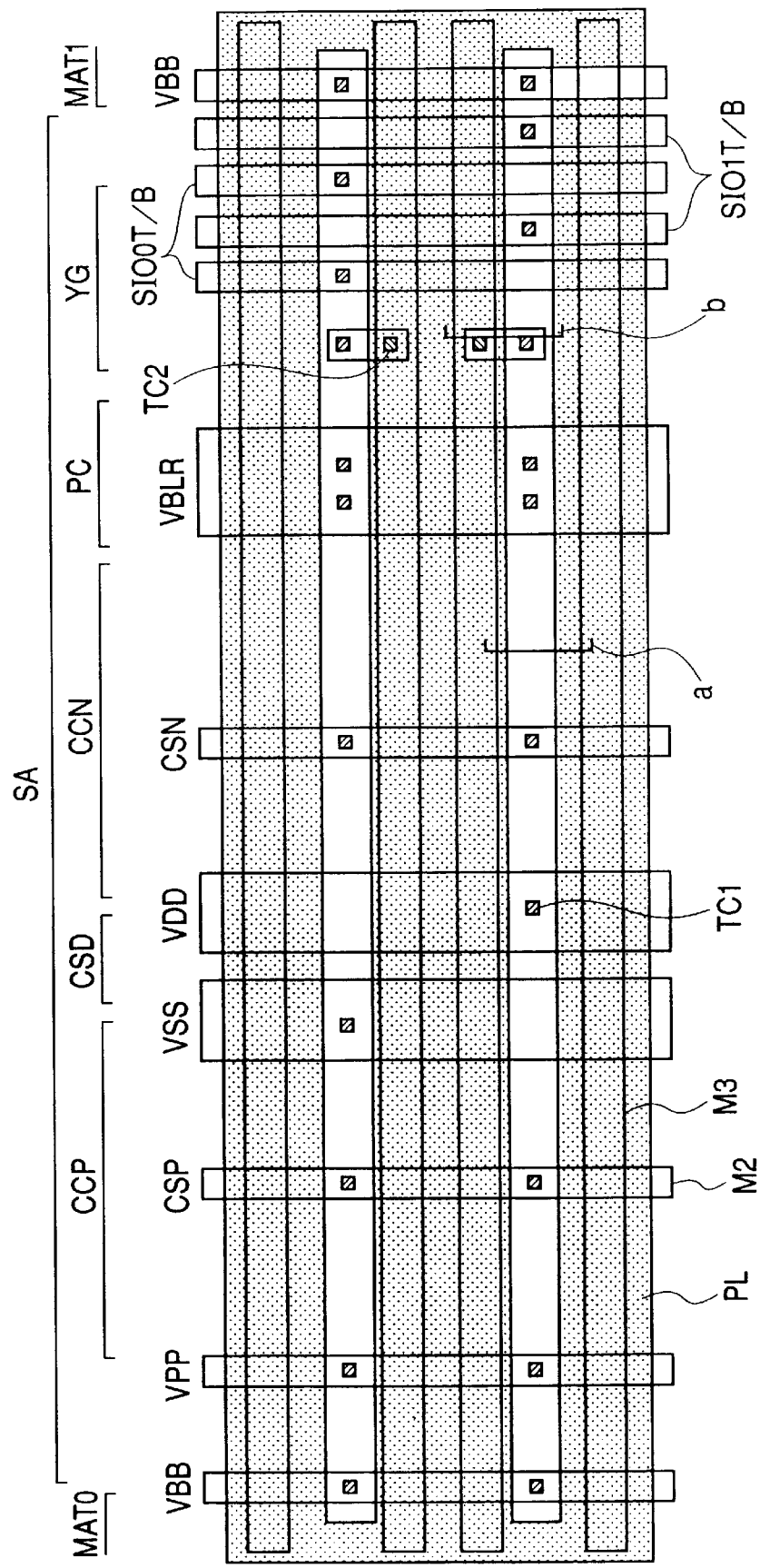
FIG. 5 is a layout diagram of an upper layer illustrating one embodiment of the sense amplifier unit of the dynamic RAM according to the present invention.

A layout of one embodiment of the sense amplifier SA shown in FIG. 3 is shown in FIGS. 4 and 5. FIG. 4 shows the layout of contact units TC1 connected to metal layers M1 and M2 corresponding to first and second layers respectively, and layers below the metal layer M1, whereas FIG. 5 shows the layout of layers above the contact unit TC1. In FIGS. 3 through 5, CCP correspond to cross-coupled P channel MOSFETs (Q7 and Q8), CSD corresponds to a common source driver (Q3 and Q4), CCN correspond to cross-coupled N channel MOSFETs (Q5 and Q6), PC corresponds to a precharge circuit (Q9 through Q11), and YG corresponds to a Y gate circuit (Q1 and Q2), respectively. They correspond to those shown in FIGS. 3 through 5.

Figure 6:
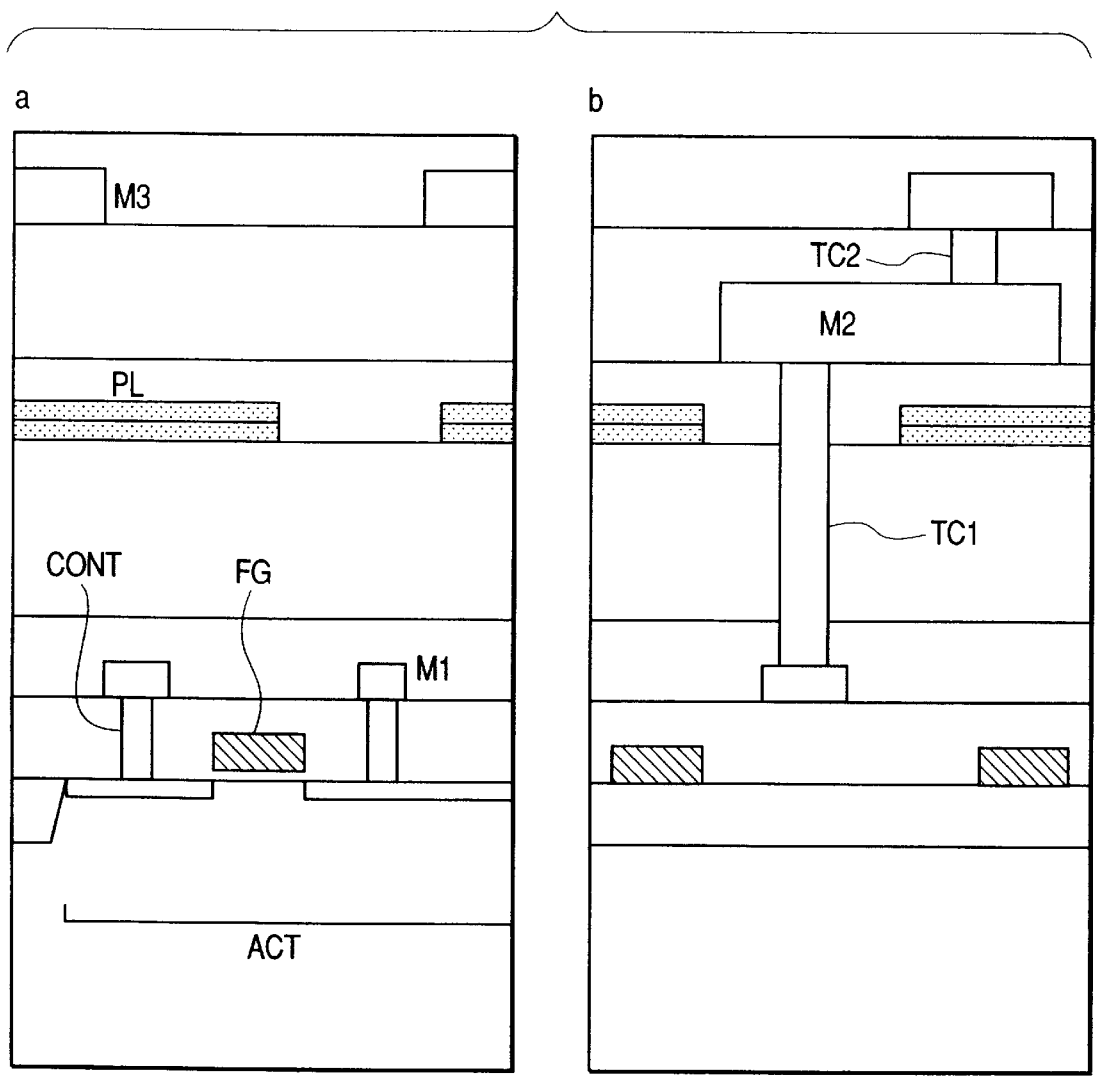
FIG. 6 is a partly sectional structural view of FIG. 5.

Sectional structures of portions indicated by a and b in FIG. 5 are shown in FIG. 6. ACT indicates an active region of each MOSFET, i.e., a device or element forming region in which a source, a drain and a channel portion are formed, FG (polysilicon corresponding to a first layer) indicates a gate electrode of each MOSFET and a sub-word line, M1, M2 and M3 respectively indicate metal wiring layers corresponding to first, second and third layers, CONT indicates a contact for connecting the M1 and FG or the M1 and ACT, TC1 indicates a contact for connecting the M2 and M1, and TC2 indicates a contact for connecting the M3 and M2, respectively.

As shown in FIG. 5, the plate electrode PL is wired from the metal wiring layer M2 corresponding to the second layer above the plate electrode PL so as to avoid an area through which the contact TC1 corresponding to a layer below the plate electrode PL passes. The plate electrodes PL0 and PL1 of the sub arrays MAT0 and MAT1 are connected to one another by wires comprising the same conductor layer as the plate electrodes PL0 and PL1. The PL wires can be provided within the SAA in plural form in the proportions of about one to the pitch equivalent to the four bit lines BL. Incidentally, since many lines equivalent to 256 as the number of the PL wires are arranged in parallel where one sub array comprises 1024 bit lines, the resistance value of a wire or interconnection for connecting the two plate electrodes provided with the sense amplifier array SAA interposed therebetween can be reduced. It is therefore possible to cancel out complementary noise developed in both plate electrodes PL1 and PL2 and greatly reduce the noise.

In the present embodiment, each storage node SN is formed in the form of a deep hole STC structure as shown in FIG. 2B. Namely, the storage node SN is formed on an inner wall of a hole defined in an interlayer dielectric and shaped in cylinder form. While the plate electrode PL falls into the cylinder-shaped storage node SN inside the storage node SN if done in this way, the plate electrode PL becomes identical to an upper portion of the storage node SN in height outside the storage node SN. Thus, since an upper portion of the plate electrode PL is flattened, it is easy to process the plate electrode PL. Accordingly, an advantage is brought about in that processing (patterning) the plate electrode PL so as to avoid the contact TC1 within the sense amplifier array SAA as described above becomes easy. Namely, a wiring portion for connecting between both plate electrodes PL0 and PL1 is formed broader in width and hence the resistance value thereof can be reduced.

Figure 7:
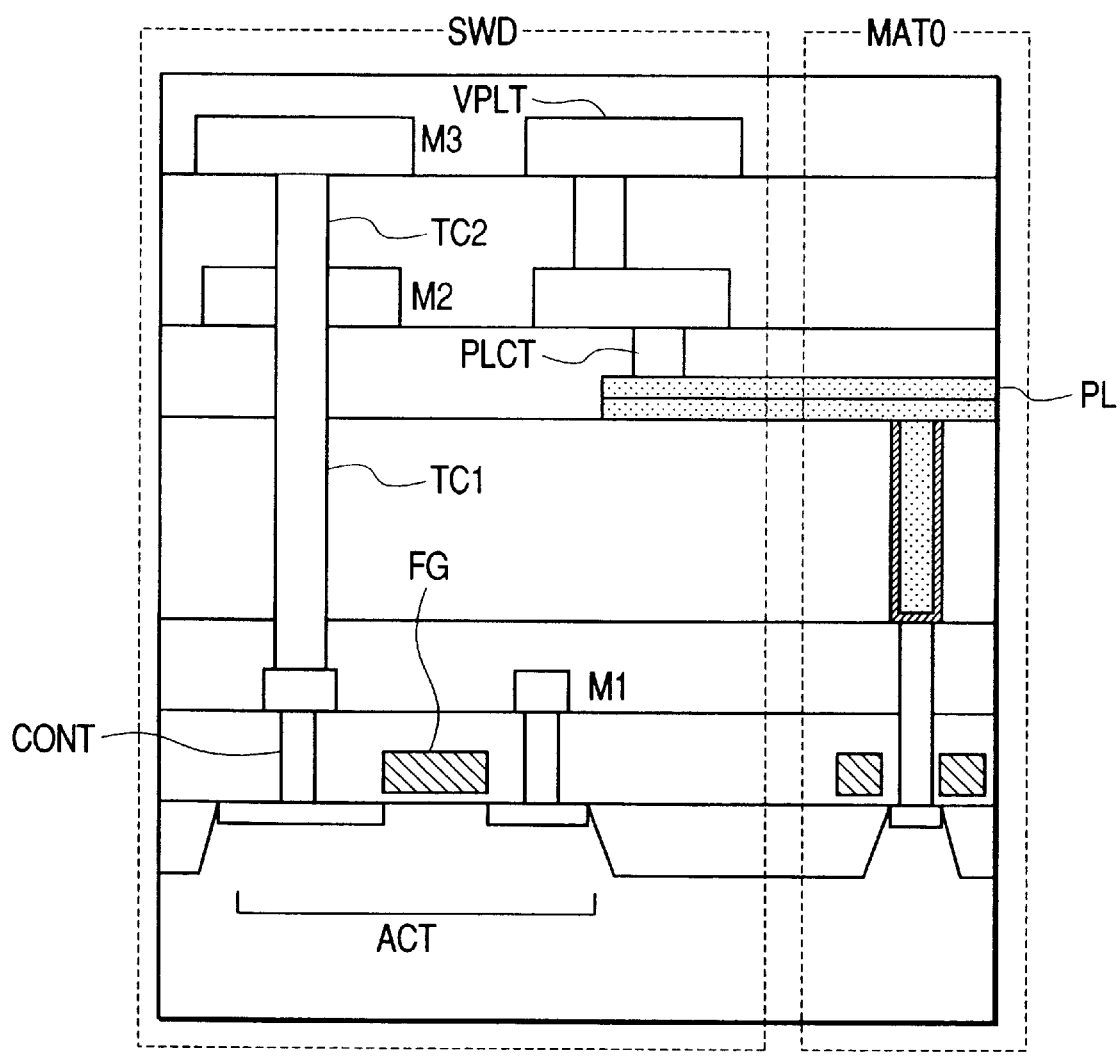
FIG. 7 is a cross-sectional view showing one embodiment of a sub-word driver unit of the dynamic RAM according to the present invention.

FIG. 7 is a cross-sectional view of one embodiment of a sub-word driver SWD. The supply of power to the plate electrode PL is carried out at the boundary between a sub-word driver array SWDA and a sub array MAT0. Since each of plate power lines VPLT wired in a bit-line BL direction is wired by a metal wiring layer M3 corresponding to a third layer, the plate power line is brought to a metal wiring layer M2 corresponding to a second layer with a contact TC2 interposed therebetween. Further, the plate power line is connected to the plate electrode PL through a contact PLCT. Incidentally, the sub-word driver SWD will be explained later with reference to FIG. 13.

Figure 8:
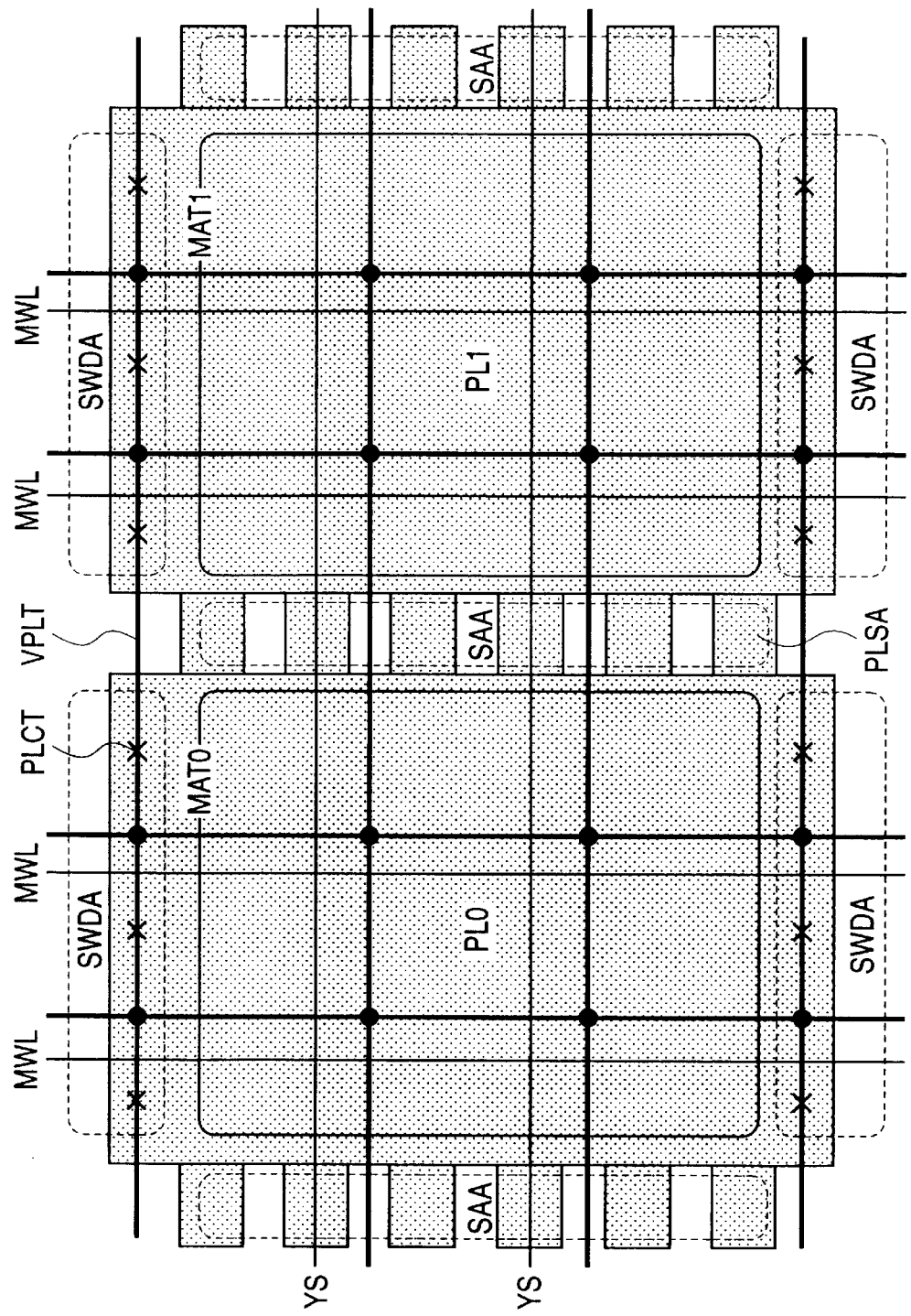
FIG. 8 is a layout diagram showing another embodiment of a method of supplying a voltage to each plate electrode employed in the dynamic RAM according to the present invention.

FIG. 8 shows the layout of another embodiment of a method of supplying a voltage to each plate electrode. In the present embodiment, wires are formed with the same electrode material as the pair of plate electrodes PL0 an PL1 to thereby interconnect the pair of plate electrodes PL0 and PL1 formed with the sense amplifier array SAA interposed therebetween, and the method of supplying the power to each plate electrode is upgraded in addition to the interconnection. The mesh wiring technology previously developed by the applicant of the present application is used for this type of power supplying method. Since the mesh wiring technology has been described in Japanese Patent Application Laid-Open No. Hei 9(1997)-135006, it is noted that a reference is made to the mesh wiring technology.

In FIG. 8, a wiring layer M3 of the same layer as column selection lines YS is used to place wires on sub-word driver arrays SWDA and sub arrays (MATs). A wiring layer M2 of the same layer as main word lines MWL is used in the transverse direction shown in each drawing orthogonal to the array selection lines YS to thereby place wires on the sub arrays in parallel thereto. On the sub arrays (MATs), these vertically and horizontally-extending wires are connected to one another by contacts TC2, thereby making it possible to reduce the resistance value of a power supply line VPLT. Further, since the value of resistance between plate electrodes PL0 and PL1 can further be reduced in addition to interconnecting portions PLSA using the above-described electrode material owing to the adoption of such a power supply wiring system, plate-electrode PL noise can be reduced.

Figure 9A:
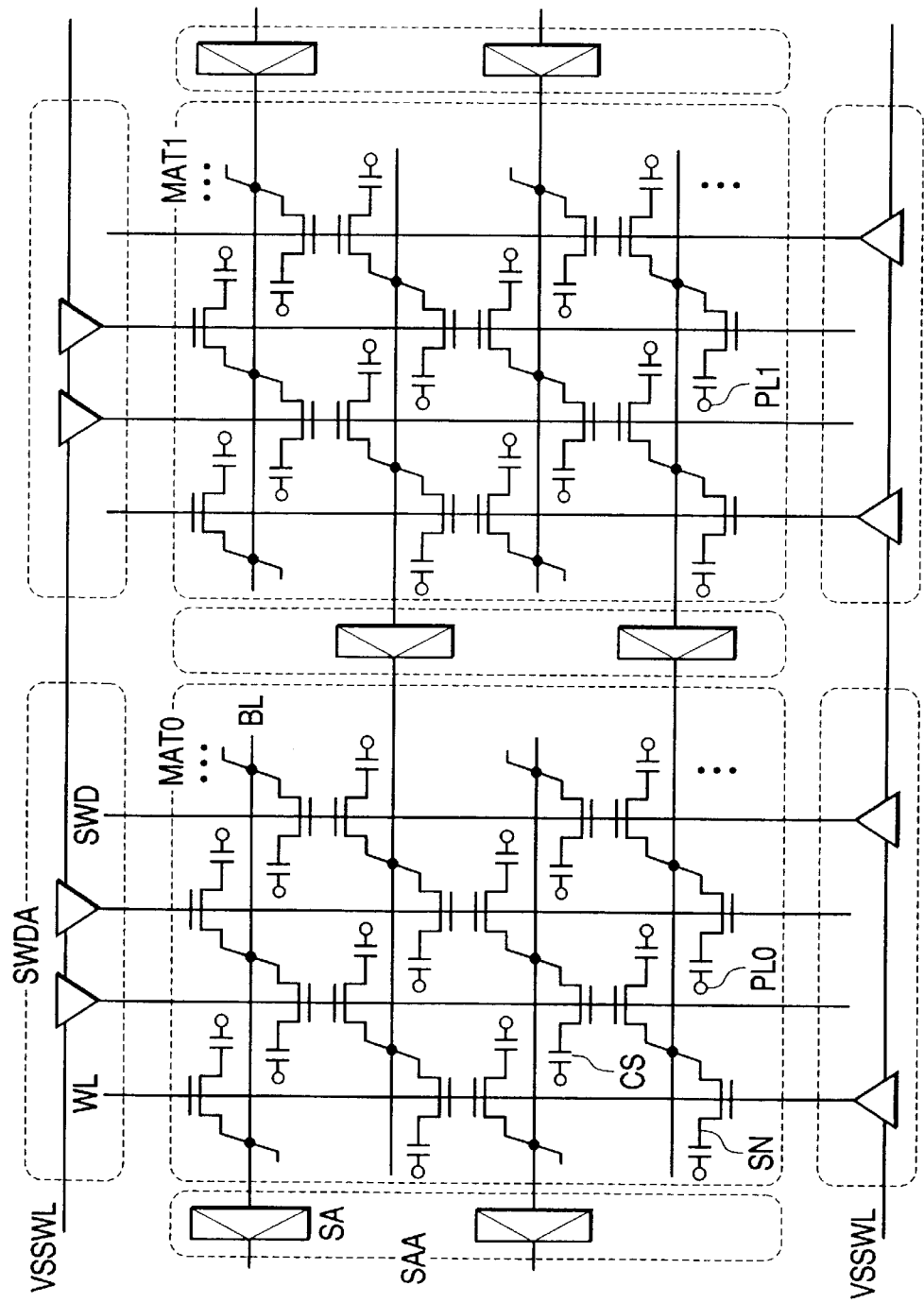
FIGS. 9A and 9B are respectively explanatory views showing one embodiment of power wires for a word line selection circuit employed in the dynamic RAM according to the present invention.
Figure 9B:
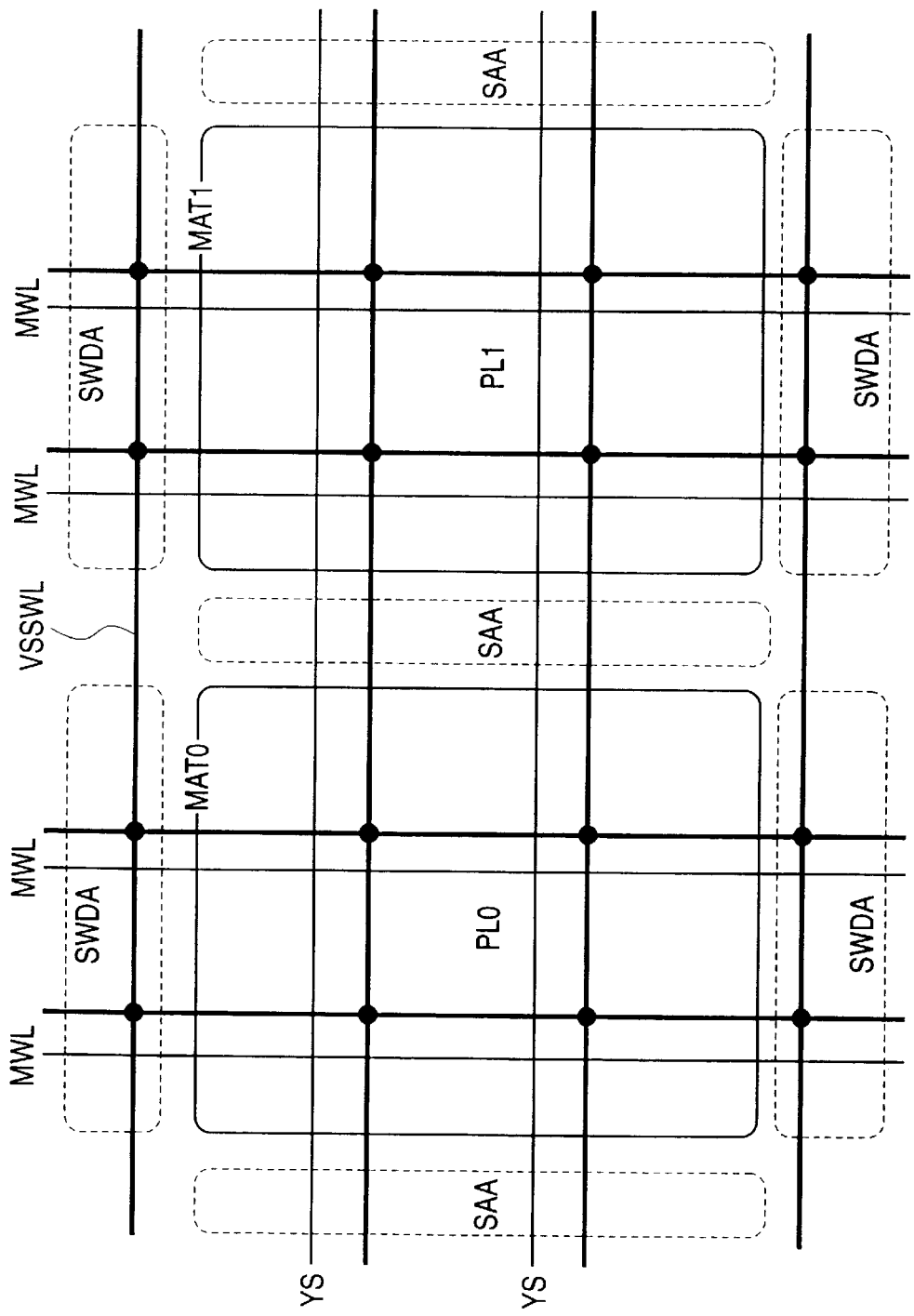

FIGS. 9A and 9B are respectively explanatory views showing one embodiment illustrative of power wires for a word line selection circuit employed in the dynamic RAM according to the present invention. FIG. 9A shows circuits corresponding to the two sub arrays MAT0 and MAT1 provided in the dynamic RAM of the hierarchical word line system such as shown in FIG. 14, and FIG. 9B shows layouts corresponding thereto, respectively. An advantageous effect can be obtained in that while only source or power VSSWL for setting sub-word lines WL to a non-selection level are shown in the drawings, a similar power wiring resistance can be reduced if each power line for supplying a boosted voltage VPP for setting each of the sub-word lines WL to a selection level is also similarly wired.

A wiring layer M3 corresponding to the same layer as column selection lines YS is used in the transverse direction in the drawings to place wires on sub-word driver arrays SWDA and sub arrays (MATs). A wiring layer M2 of the same layer as main word lines MWL is used in the longitudinal direction in each drawing to thereby place wires on the sub arrays. On the sub arrays, these vertically and horizontally-extending wires are connected to one another by contacts TC2, whereby the resistance value of the power supply line VSSWL can be reduced. Further, the value of resistance between a sub-word driver SWD power supply of the sub array MAT0 and a sub-word driver SWD power supply of the sub array MAT1 can be reduced owing to the adoption of such a wiring system. Thus, noise developed in the sub-word line WL upon sensing each bit line BL can be reduced, whereby an operating margin for a one-intersection DRAM array can greatly be enlarged in a manner similar to the embodiment shown in FIG. 1, for example.

Figure 10:
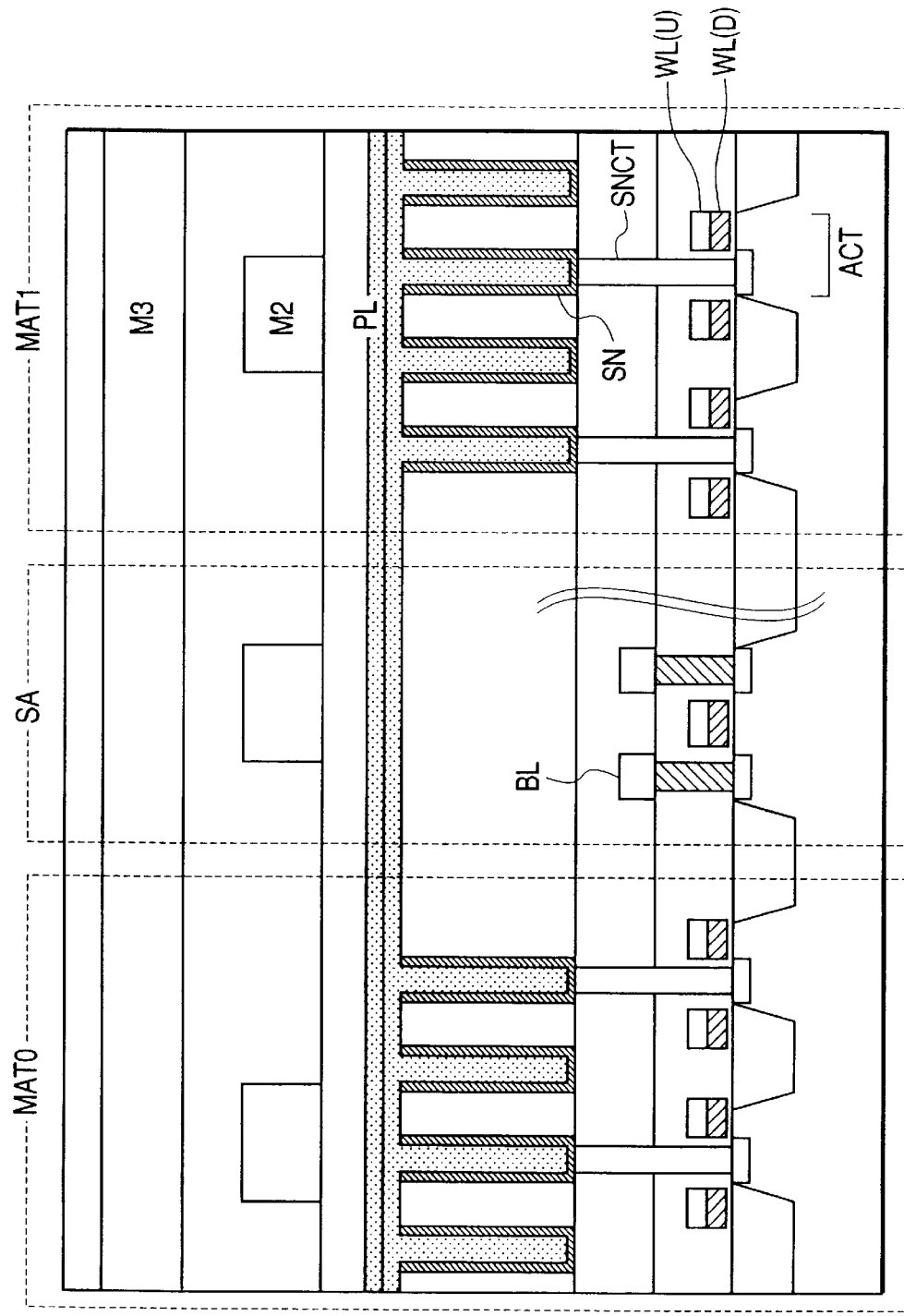
FIG. 10 is a cross-sectional view illustrating one embodiment of a dynamic memory cell according to the present invention.

FIG. 10 is a cross-sectional view of one embodiment of a dynamic memory cell according to the present invention. In the present embodiment, the resistance value of each sub-word line is lowered with the sub-word lines as a laminated structure. As one example, a sub-word line WL (D) corresponding to a lower layer is comprised of poly Si, and tungsten having a low resistance can be used for a sub-word line WL (U) corresponding to an upper layer. Thus, since noise developed in each sub-word line WL is canceled out at high speed when the resistance value of the sub-word line is reduced, sub-word line WL noise is reduced. Alternatively, word lines may be configured by the word lines having such a laminated structure as described above in addition to a hierarchical structure comprising main word lines and sub-word lines. Further, the word lines may be ones to which memory cells corresponding to the four sub arrays are connected. Even in this case, a similar advantageous effect can be obtained in that the resistance value of each word line is lowered to thereby reduce noise placed thereon.

Figure 11:
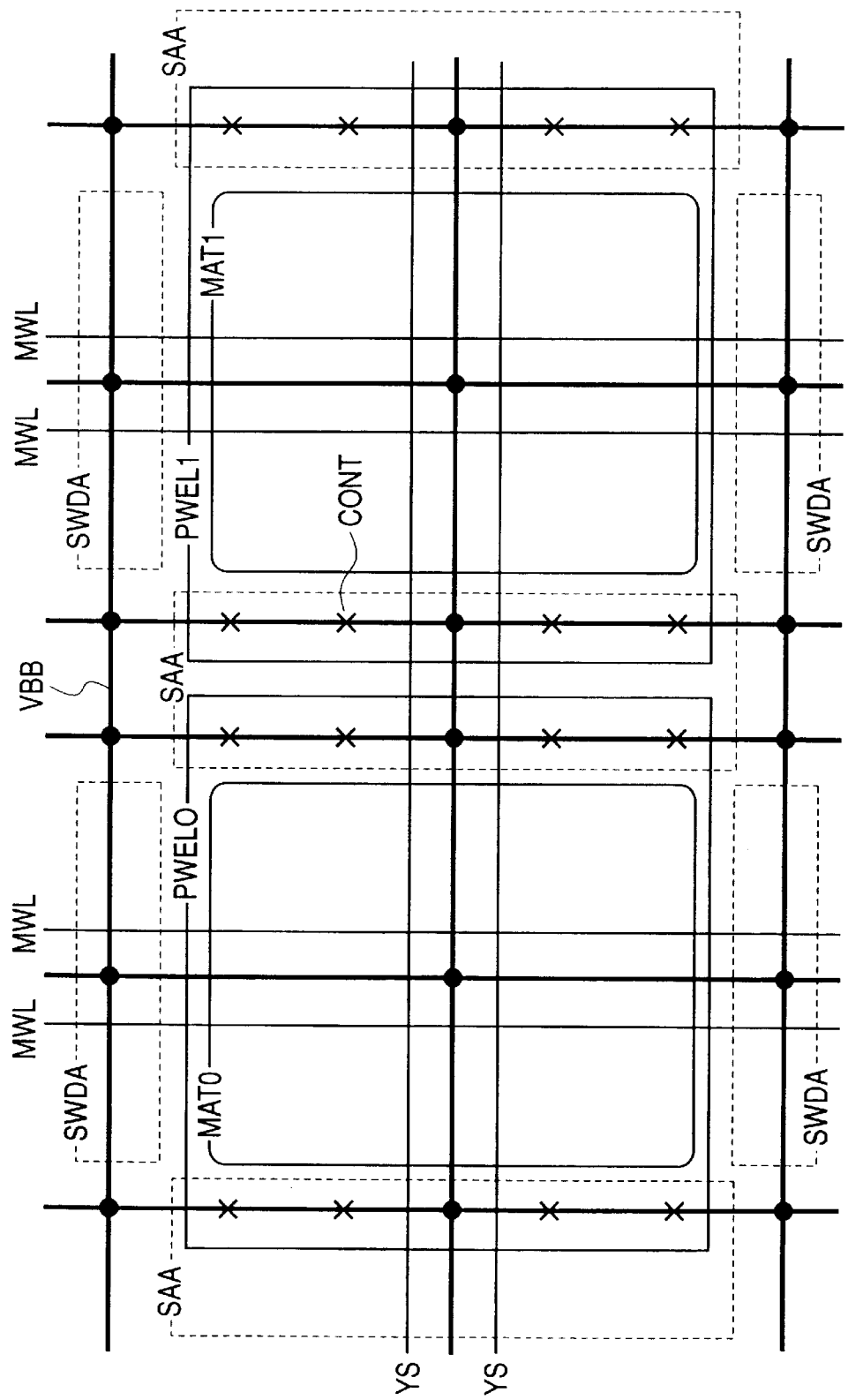
FIG. 11 is a layout diagram depicting one embodiment of a method of wiring a substrate power supply employed in the dynamic RAM according to the present invention.
Figure 12:
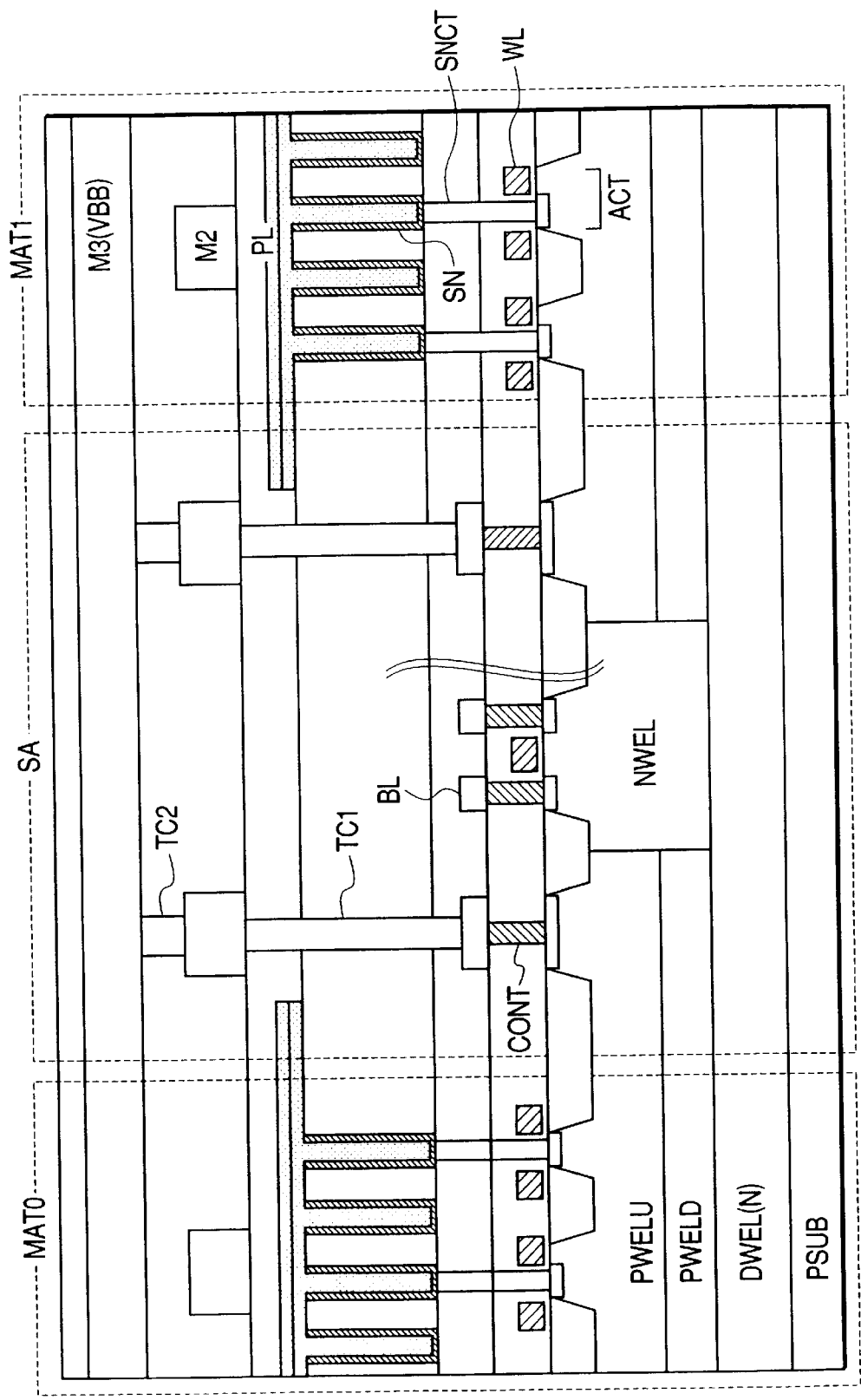
FIG. 12 is a cross-sectional view showing other embodiments of the memory cell and the sense amplifier unit employed in the dynamic RAM according to the present invention.

FIG. 11 shows the layout of one embodiment of a method of wiring a substrate source or power supply employed in the dynamic RAM according to the present invention. The supply of a substrate power supply VBB to a substrate PWEL with memory cells formed thereon is carried out at the boundary between each of sense amplifier arrays SAA and its corresponding sub array MAT. FIG. 12 is a cross-sectional view showing a boundary region between a sub array MAT0 and a sub array MAT1. Since a PWEL power supply line VBB wired in the direction of extension of each word line WL is wired with a metal wiring layer M2 corresponding to a second layer, the PWEL power supply line VBB is temporarily brought down to a metal wiring layer M1 corresponding to a first layer through each contact TC1, followed by connection to a P type well PWEL through a contact CONT.

An N-type well NWEL for forming P channel MOSFETs Q7 and Q8, etc. exists in the sense amplifier array SAA. Therefore, when a deep MNWL (DWEL) is placed below the sense amplifier SA and each sub array MAT by using a triple well structure, a P-type well region PWEL used as the substrate for each memory cell is separated on both sides of the sense amplifier array SAA. Thus, when contact with the P-type well region PWEL is done on both sides of the N-type well region NWEL within one sense amplifier array SAA, substrate noise can be reduced.

As to wiring for the substrate bias voltage VBB, a wiring layer M3 corresponding to the same layer as column selection lines YS is used in the longitudinal direction in FIG. 11 to place wires on each sub-word driver array SWDA and sub array MAT. A wiring layer M2 corresponding to the same layer as main word lines MWL is used in the longitudinal direction to thereby place wires on the sense amplifier array SAA and the sub arrays. On the sub arrays, these vertically and horizontally-extending wires are connected to one another by contacts TC2, whereby the resistance value of a power supply line for supplying the substrate bias voltage VBB can be reduced. Further, the resistance between P-type well regions PWEL0 and PWEL1 corresponding to the sub arrays MAT0 and MAT1 can be reduced owing to the adoption of such a wiring system. According to the present embodiment, noise developed in the substrate when the potential on each bit line BL is amplified according to the amplifying operation of the sense amplifier SA, can be canceled out at high speed and reduced, whereby an operating margin for a one-intersection DRAM array can greatly be enlarged in a manner similar to the embodiment shown in FIG. 1.

FIG. 12 is a cross-sectional view of other embodiments of the memory cell and the sense amplifier unit employed in the dynamic RAM according to the present invention. In the cross-sectional view of the memory cell, the resistance of PWEL is reduced with the substrate PWEL for the memory cell as a laminated structure. As one example, a region PWELU for determining the operation of a memory cell MOSFET corresponding to an upper layer is defined as Si doped in low concentrations. A PWELD corresponding to a lower layer is defined as Si doped in high concentrations for a reduction in resistance. Since noise produced in the substrate is canceled out at high speed when the resistance of the substrate is lowered in this way, substrate noise is reduced.

Figure 13:
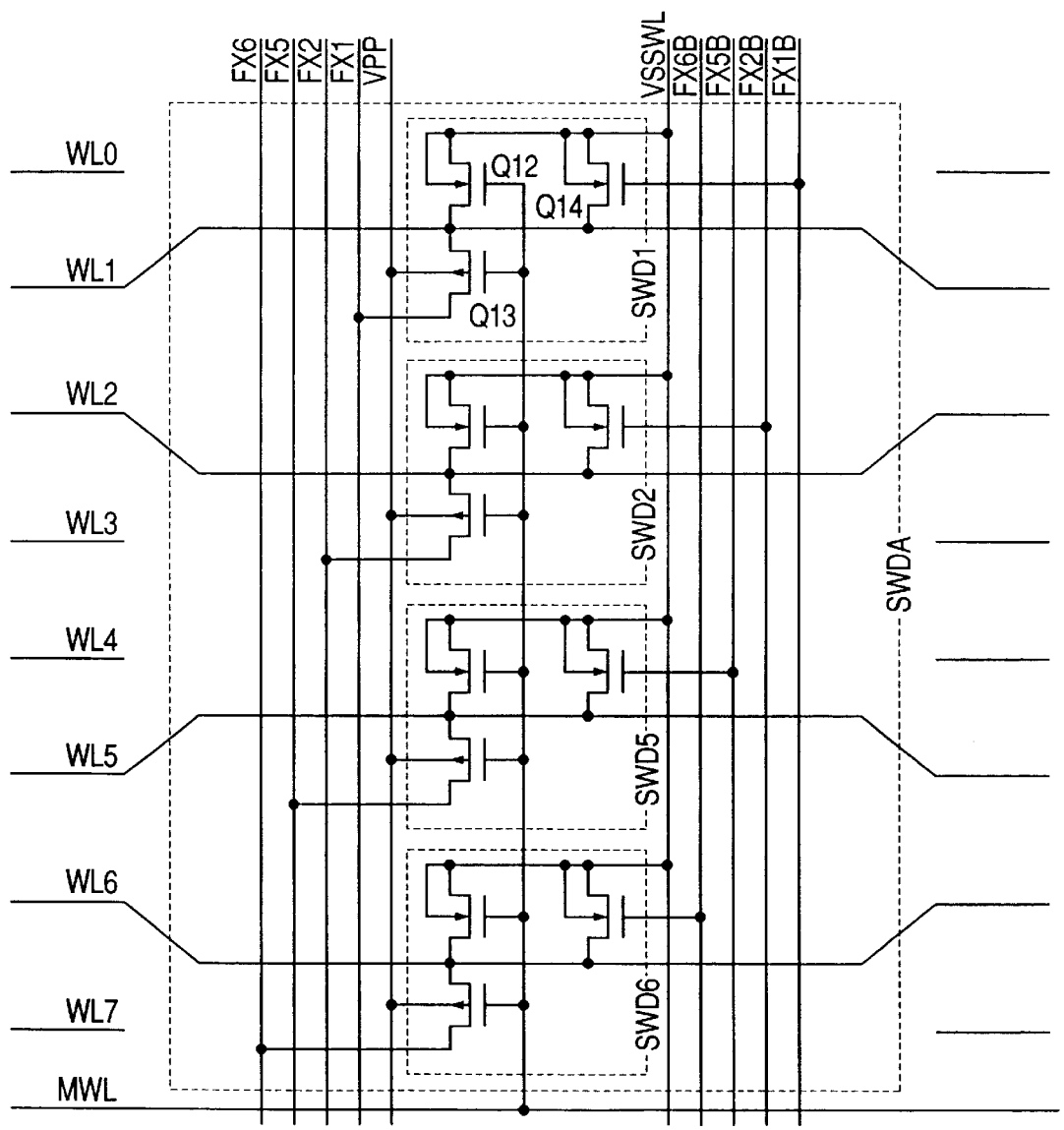
FIG. 13 is a circuit diagram illustrating one embodiment of a sub-word driver employed in the dynamic RAM according to the present invention.

FIG. 13 is a circuit diagram of one embodiment of a sub-word driver employed in the dynamic RAM according to the present invention. In the present embodiment, one main word line MWL is provided with respect to eight sub word lines WL0 through WL7. Sub-word selection lines FXO through FX7 and FX0B through FX7B are required to select one sub-word line from the eight sub-word lines. In the present embodiment, bit lines provided in one sub array are selected half by half by sub-word driver arrays SWDA provided on both sides thereof. Therefore, eight sub-word selection lines FX1, 2, 5 and 6 and FX1B, 2B, 5B and 6B for selecting the four sub-word lines corresponding to the half of the eight sub-word lines are extended over one sub-word driver array shown in the same drawing.

Eight sub-word selection lines FX0, 3, 4 and 7 and FX0B, 3B, 4B and 7B for selecting the four sub-word lines corresponding to the remaining half of the eight sub-word lines are extended over sub-word driver arrays provided on the opposite side with the unillustrated sub array interposed therebetween. Sub-word drivers corresponding to sub-word lines WL1 and WL2, WL2 and WL4, and WL5 and WL6 set with the two as each pair are alternately provided. Further, a sub-word line WL0 and a group sub-word line WL7 (different in main word line) adjacent thereto are set as one pair and two sub-word drivers are provided therefor.

One sub-word driver SWD1 comprises a CMOS inverter circuit comprising an N channel MOSFET Q12 and a P channel MOSFET Q13, and an N channel MOSFET Q14 provided in parallel to the N channel MOSFET Q12. The sources of the N channel MOSFETs Q12 and 14 are respectively electrically connected to a power supply line VSSWL corresponding to a non-selection level VSS (OV) of a sub-word line. A power supply line VPP for supplying a boosted voltage is provided in an N well region in which the P channel MOSFET Q13 is formed. These power supply lines make use of such a mesh-structured wire as in the embodiment referred to above.

The gates of the MOSFETs Q12 and Q13 constituting the CMOS inverter circuit of the sub-word driver SWD1 are electrically connected to their corresponding main word line MWL in common with the gates of similar MOSFETs in the remaining three sub-word drivers. The sources of the P channel MOSFETs Q13 constituting the four CMOS inverter circuits are electrically connected to their corresponding sub-word selection line FX1. The sub-word selection line FX1B is provided for the gate of the MOSFET Q14 provided in the sub-word driver SWD1. The sub-word selection lines FX2 and FX2B, FX5 and FX5B, and FX6 and FX6B are respectively electrically connected to the remaining three sub-word drivers SWD2, SWD5 and SWD6.

When the sub-word line WL1 is selected, the main word line MWL is brought to a low level. Further, the sub-word selection line FX1 corresponding to the sub-word line WL1 is brought to a high level like a boosted voltage VPP. Thus, the P channel MOSFET Q13 of the sub-word driver SWD1 is turned on to transfer the selection level VPP on the sub-word selection line FX1 to the sub-word line WL1. At this time, the MOSFET Q14 is kept in an off state in response to a low level of the sub-word selection line FX1B in the sub-word driver SWD1.

In other sub-word drivers SWD2, SWD5 and SWD6 in which the main word line MWL is brought to a selected state corresponding to a low level, the P channel MOSFETs are turned on. However, the N channel MOSFETs are turned on according to high levels of the sub-word selection lines FX2B, FX5B and FX6B to bring the sub-word lines WL2, WL5 and WL6 to the non-selection level VSS. In the non-selected sub-word drivers in which the main word line MWL is brought to the high level, the N channel MOSFETs of the CMOS inverter circuits are turned on by the high level of the main word line MWL to thereby bring each individual sub-word lines to the non-selection level VSS.

Since the pair of sub-word lines corresponding to the two sub arrays is selected by the three MOSFETs in this way, sub-word drivers can be formed so as to coincide with the pitches of the sub-word lines WL provided in the memory array (sub-array) of the open bit line system and placed in high concentrations. Sub-word drivers can be laid out which are adapted to one-intersection or open bit line system capable of ideally reducing each cell size to 75% by using the same design rule as one for a two-intersection system.

When the sub-word drivers are dispersively laid out on both sides of each sub array MAT according to two-by-two combinations every two sub-word lines WL as described above, the P channel MOSFETs constituting the two sub-word drivers can be formed in the same N type well region, and the N channel MOSFETs can be formed in the same P type well region. As a result, the sub-word drivers can be brought into high integration. This is similar even to the above-described sense amplifiers, which are dispersively placed on both sides of each sub array MAT according to two-by-two combinations every two bit lines BL.

Figure 15:
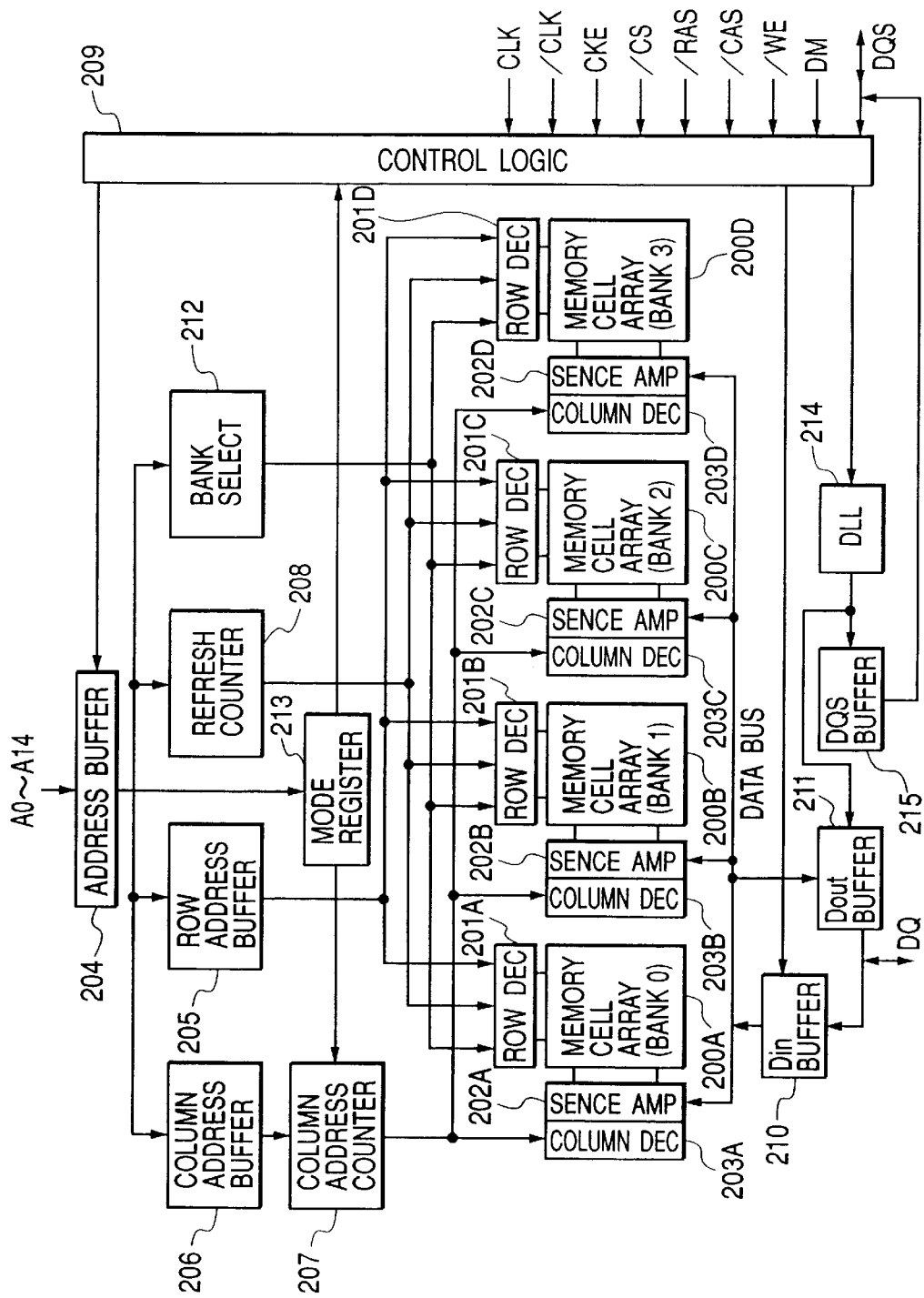
FIG. 15 is a block diagram showing one embodiment of a dynamic RAM according to the present invention.

FIG. 15 is a block diagram showing one embodiment of a dynamic RAM according to the present invention. The dynamic RAM showing the present embodiment is intended for a DDR SDRAM (Double Data Rate Synchronous Dynamic Random Access Memory; hereinafter called simply "DDR SDRAM"). Although not restricted in particular, the DDR SDRAM according to the present embodiment is provided with four memory arrays 200A through 200D in association with four memory banks. The memory arrays 200A through 200D respectively associated with the four memory banks 0 through 3 are equipped with dynamic memory cells placed in matrix form. According to the drawing, selection terminals of memory cells placed in the same column are connected to their corresponding word lines (not shown) set every columns, and data input/output terminals of memory cells placed in the same row are connected to complementary data lines (not shown) set every rows.

One of unillustrated word lines in the memory array 200A is driven to a selection level according to the result of decoding of each row address signal by a row decoder (Row DEC) 201A. Unillustrated complementary data lines in the memory array 200A are coupled to their corresponding I/O lines of a sense amplifier (Sense AMP) 202A and a column selection circuit (Column Dec) 203A. The sense amplifier 202A is a circuit for detecting small potential differences which appear on the respective complementary data lines according to the reading of data from memory cells and amplifying the same. The column selection circuit 203A provided for the sense amplifier 202A includes a switch circuit for selecting the complementary data lines separately and bringing the selected ones and complementary I/O lines into conduction. The column switch circuit is selectively operated according to the result of decoding of each column address signal by the column decoder 203A.

The memory arrays 200B through 200D are also similarly provided with row decoders 201B through 201D, sense amplifiers 203B through 203D and column selection circuits 203B through 203D respectively. The complementary I/O lines are shared among the respective memory banks and connected to an output terminal of a data input/output circuit (Din Buffer) 210 having a write buffer and an input terminal of a data output circuit (Dout Buffer) 211 including a main amplifier. Although not restricted in particular, a terminal DQ serves as a data input/output terminal for inputting or outputting data D0 through D15 comprising 16 bits. A DQS buffer (DQS buffer) 215 forms or produces a data strobe signal for data outputted from the terminal DQ upon a read operation.

Address signals A0 through A14 supplied from an address input terminal are temporarily stored in an address buffer (Address Buffer) 204. Of the address signals inputted in time sequence, row address signals are stored in a row address buffer (Row Address Buffer) 205, and column address signals are stored in a column address buffer (Column Address Buffer) 206. A refresh counter (Refresh Counter) 208 generates row addresses at automatic refresh (Automatic Refresh) and self refresh (Self Refresh).

In the case of a storage capacity of 256 Mbits, for example, an address terminal for inputting the address signal A14 as the column address signal is provided when a memory access is carried out in 2 bit units. In an×4-bit configuration, the address signals up to the address signal A11 are rendered valid. In an×8-bit configuration, the address signals up to the address signal A10 are made valid, and the address signals up to the address signal A9 are rendered valid in an×16-bit configuration. In the case of a storage capacity of 64 Mbits, the address signals up to the address signal A10 are rendered valid in an×4-bit configuration, and the address signals up to the address signal A9 are made valid in an×8-bit configuration. Further, the address signals up to the address signal A8 are set valid in an×16-bit configuration as shown in the drawing.

The output of the column address buffer 206 is supplied to a column address counter (Column Address Counter) 207 as preset data therefor. The column address counter 207 outputs column address signals defined as the preset data or values obtained by sequentially incrementing the column address signals to the column address decoders 203A through 203D in a burst mode specified by a command or the like to be described later.

A mode register(Mode Register) 213 holds various operation mode information therein. Of the row decoders (Row Decoders) 201A through 201D, only one corresponding to the bank specified by a bank select (Bank Select) circuit 212 is activated to allow the operation of selecting a word line. Although not restricted in particular, a control circuit (Control Logic) 209 is supplied with external control signals such as clock signals CLK, /CLK (symbol/means that signals marked therewith are row enable signals), a clock enable signal CKE, a chip select signal /CS, a column address strobe signal /CAS, a row address strobe signal /RAS and a write enable signal /WE, etc., /DM and DQS, and address signals inputted through the mode register 213. The control circuit 209 forms internal timing signals for controlling an operation mode for the DDR SDRAM and the operations of the circuit blocks, based on changes in the levels of these signals, timing, etc. and is provided with input buffers respectively corresponding to the signals.

The clock signals CLK and /CLK are inputted to a DLL circuit 214 through a clock buffer, from which an internal clock is generated. Although not restricted in particular, the internal clock is used as a signal to be inputted to each of the data output circuit 211 and the DQS buffer 215. The clock signals sent via the clock buffer are supplied to clock terminals used for the supply to the data input circuit 210 and the column address counter 207.

Other external input signals are rendered significant in synchronism with the rising edge of the internal clock signal. The chip select signal /CS provides instructions for the commencement of a command input cycle according to its low level. When the-chip select signal /CS is of a high level (kept in a chip non-selected state), other inputs do not make sense. However, the state of selection of each memory bank, and its internal operations such as a burst operation, etc. to be described later are not affected by a change to the chip non-selected state. The respective signals /RAS, /CAS and /WE are different in function from corresponding signals employed in the normal DRAM and are set as significant signals upon defining command cycles to be described later.

The clock enable signal CKE is a signal for indicating the effectiveness of the next clock signal. If the signal CKE is of a high level, then the rising edge of the next clock signal CLK is regarded as valid. If the signal CKE is of a low level, it is then rendered invalid. Incidentally, when an external control signal /OE for performing output enable control on the data output circuit 211 in a read mode is provided, such a signal /OE is also supplied to the control circuit 209. When the signal is high in level, for example, the data output circuit 211 is brought to a high-output impedance state.

The row address signals are defined based on the levels of A0 through A11 in a row address strobe/bank active command cycle to be described later synchronized with the rising edge of the clock signal CLK (internal clock signal).

The address signals A12 and A13 are regarded as bank select signals in the row address strobe/bank active command cycle. Namely, one of the four memory banks 0 through 3 is selected according to a combination of A12 and A13. Although not restricted in particular, the selection control on the memory banks can be carried out according to processes such as the activation of only a row decoder on the selected memory bank side, the non-selection of all the column switch circuits on the non-selected memory bank side, connections to the data input circuit 210 and the data output circuit 211 on only the selected memory bank side, etc.

When the×16-bit configuration is set in 256 Mbits as described above, the column address signals are defined according to the levels of A0 through A9 in a read or write command (corresponding to a column address/read command or a column address/write command to be described later) cycle synchronized with the rising edge of the clock signal CLK (internal clock) . Each of the column addresses defined in this way is set as a start address for a burst access.

Main operation modes of the SDRAM, which are instructed by commands, will next be explained.

(1) Mode register set command (Mo):

This is a command for setting the mode register 30. The corresponding command is specified by /CS, /RAS, /CAS and /WE=low level. Data (register set data) to be set is supplied through each of A0 through A11. Although not restricted in particular, the register set data includes a burst length, a CAS latency, a write mode, etc. Although not restricted in particular, a settable burst length takes 2, 4 and 8 and a settable CAS latency assumes 2 and 2.5. A settable write mode is defined as burst write and single write.

The CAS latency indicates what cycles of internal clock signal are wasted from the falling edge of the /CAS to the output operation of the output buffer 211 upon a read operation specified by a column address/read command to be described later. Since an internal operation time used for the reading of data is required until the read data is established or determined, the CAS latency is used to set the internal operation time according to the use frequency of the internal clock signal. In other words, when an internal clock signal of a high frequency is used, the CAS latency is set to a relatively large value. On the other hand, when an internal clock signal of a low frequency is used, the CAS latency is set to a relatively small value.

(2) Row address strobe/bank active command (Ac):

This is a command for providing instructions for a row address strobe and making the selection of memory banks based on A12 and A13 effective. This command is specified according to /CS and /RAS=low level and /CAS and /WE= high level. At this time, addresses supplied to A0 through A9 are taken in or captured as row address signals, whereas signals supplied to A12 and A13 are captured as signals for selecting the memory banks. Their capture operations are executed in synchronism with the rising edge of the internal clock signal as described above. When the corresponding command is specified, for example, a word line in a memory bank specified by the command is selected. Thus, memory cells connected to the corresponding word line and their corresponding complementary bit lines are brought into conduction.

(3) Column address/read command (Re):

This is a command required to start a burst read operation. Further, this is also a command for providing instructions for a column address strobe. The present command is specified according to /CS and /CAS=low level and /RAS and /WE= high level. Column addresses supplied to A0 through A9 (in the case of the×16-bit configuration) at this time are captured as column address signals respectively. Thus, the captured column address signals are supplied to the column address counter 207 as burst start addresses.

Before the burst read operation specified thereby, a memory bank and a word line lying therein have been selected in the row address strobe/bank active command cycle. Upon the burst read operation in this state, memory cells connected to the selected word line are successively selected in accordance with each address signal outputted from the column address counter 207 in synchronism with the internal clock signal and items of data are sequentially read therefrom. The number of the sequentially-read data is set as a number specified by the above burst length. The output buffer 211 starts reading data while waiting for the number of cycles in the internal clock signal defined by the CAS latency.

(4) Column address/write command (Wr):

The corresponding command is specified according to /CS, /CAS and /WE=low level and /RAS=high level. Addresses supplied to A0 through A9 at this time are captured as column address signals. Thus, the captured column address signals are supplied to the column address counter 207 as burst start addresses upon the burst write. The procedure of the burst write operation specified thereby is also performed in a manner similar to the burst read operation. However, no CAS latency is provided for the write operation and the capturing of the write data is started from after one clock of the column address/write command cycle.

(5) Precharge command (Pr):

This is defined as a command for starting a precharge operation on each memory bank selected by A12 and A13. This command is specified by /CS, /RAS and /WE=low level and /CAS=high level.

(6) Autorefresh command:

This is a command required to start autorefresh and specified by /CS, /RAS and /CAS=low level and /WE and CKE=high level.

(7) No-operation command (Nop):

This is a command for indicating the non-execution of a substantial operation and specified by /CS=low level and /RAS, /CAS and /WE=high level.

When another memory bank is specified in the course of the burst operation and the row address strobe/bank active command is supplied while the burst operation is being performed by one memory bank in the DDR SDRAM, no influence is exerted on the operation of one memory bank being under the corresponding execution, and the operation of a row address system in another memory bank is allowed.

Thus, unless D0 through D15 collide with one another at a data input/output terminal comprising 16 bits, for example, the precharge command and the row address strobe/bank active command for a memory bank different from a memory bank to be processed or handled by an unfinished command are issued during the execution of the corresponding command to thereby allow the commencement of an internal operation in advance. Since the DDR SDRAM according to the present embodiment performs the memory access in 16-bit units, has the addresses corresponding to about 4M, based on the addresses of A0 through A11, and comprises the four memory banks as described above, it has a storage capacity of about 256 Mbits (4M×4 banks×16 bits) as a whole.

A detailed read operation of the DDR SDRAM is as follows. The respective signals of the chip select /CS, /RAS and /CAS and write enable /WE are inputted in synchronism with the CLK signal. A row address and a bank select signal are inputted simultaneously with /RAS=0 and held in the row address buffer 205 and the bank select circuit 212 respectively. The row decoder 210 for the bank designated by the bank select circuit 212 decodes a row address signal and hence the corresponding, memory cell array 200 outputs row overall data as a small signal. The outputted small signal is amplified by and held in the corresponding sense amplifier 202. Thus, the specified bank is rendered active (Active).

After 3 CLKs since the input of the row address, a column address and a bank select signal are inputted simultaneously with CAS=0 and respectively held in the column address buffer 206 and the bank select circuit 212. If the specified bank is active, then the held column address is outputted from the column address counter 207 and the corresponding column decoder 203 selects a column. The selected data is outputted from the sense amplifier 202. The data outputted at this time corresponds to two pairs or sets (8 bits in×4-bit configuration and 32 bits in×16-bit configuration).

The data outputted from the sense amplifier 202 is outputted from the data output circuit 211 to the outside of the chip through a data bus DataBus. Timing provided to output it is synchronized with both the rising and falling edges of QCLK outputted from the DLL 214. At this time, the two pairs of data are parallel-to-serial converted into data of one pair×two as described above. Simultaneously with the output of the data, the DQS buffer 215 outputs a data strobe signal DQS therefrom. When the burst length stored in the mode register 213 is 4 or more, the column address counter 207 automatically increments addresses to read out the next column data.

The DLL 214 plays a role in producing an operating clock for the data output circuit 211 and the DQS buffer 215. In the data output circuit 211 and the DQS buffer 215, time is required between the input of the internal clock signal generated by the DLL 214 thereto and the output of the data signal and the data strobe signal therefrom. Therefore, a suitable replica circuit is used to advance the phase of the internal clock signal ahead of the external CLK, thereby allowing the phases of the data signal and the data strobe signal to coincide with that of the external clock CLK. Thus, the DQS buffer is brought to an output high impedance state except for the above data output operation.

Since the DQS buffer 215 of the DDR SDRAM is kept in the output high impedance state upon a write operation, a data strobe signal DQS is inputted to the terminal DQS from a data processor such as a microprocessor or the like, and write data synchronized therewith is inputted to the terminal DQS. The data input circuit 210 captures, serially as described above, the write data inputted from the terminal DQS according to a clock signal formed based on the data strobe signal inputted from the terminal DQS, converts the data into parallel form in synchronism with the clock signal CLK, followed by transfer to a memory bank selected through the data bus DataBus. Further, the data is written into a selected memory cell of such a memory bank.

Owing to the application of the invention of the present application to the above-described DDR SDRAM, a semiconductor memory capable of high-speed writing and reading can be configured while a memory chip is being reduced in size.

Operations and effects obtained from the above-described embodiments are as follows:

(1) An advantageous effect can be obtained in that in a dynamic RAM comprising a plurality of word lines respectively connected to address select terminals of a plurality of dynamic memory cells, a plurality of complementary bit line pairs respectively connected to input/output terminals of the plurality of dynamic memory cells and placed in directions opposite to one another, and a sense amplifier array which is supplied with an operating voltage according to an operation timing signal and comprises a plurality of latch circuits for respectively amplifying the differences in voltage between the complementary bit line pairs, common electrodes provided in opposing relationship to storage nodes corresponding to connecting points between address select MOSFETs and information storage capacitors of the plurality of dynamic memory cells provided on both sides with the sense amplifier array as the center are connected to one another while circuit connections in the sense amplifier array are being ensured by wiring means using the common electrodes, thereby making it possible to cancel out and hence greatly reduce complementary noise developed in two plate electrodes provided with the sense amplifier array interposed therebetween.

(2) An advantageous effect can be obtained in that since the storage capacitors are formed above the bit lines as the dynamic memory cells in addition to the above, the processing of wires interconnected with the sense amplifier array interposed therebetween becomes easy and hence a further reduction in the resistance of the wiring means using the plate electrodes themselves can be implemented.

(3) An advantageous effect can be obtained in that since the plate electrodes other than the capacitors can be flattened in that electrodes placed below the storage capacitors respectively take cylindrical shapes formed on inner walls of holes defined in an interlayer dielectric in addition to the above, the patterning of the wires interconnected with the sense amplifier array interposed therebetween becomes easy, whereby the wiring means using the plate electrodes themselves can be further reduced in resistance.

(4) An advantageous effect can be obtained in that since the common electrodes are formed of a laminated or multilayered film obtained by stacking the common electrodes on ruthenium or TiN in addition to the above, a sheet resistance value thereof can be lowered and complementary noise developed in the plate electrodes can be canceled out more effectively.

(5) An advantageous effect can be obtained in that a precharge circuit for supplying an intermediate voltage of the operating voltage for the sense amplifier to the complementary bit line pair, and column switch MOSFETs for connecting complementary input/output lines extended along the sense amplifier array and the complementary bit lines in response to a Y select signal received at their gates are provided in the sense amplifier array in addition to the above, whereby the complementary bit lines can be divided into suitable ones and the amount of signals necessary for the sense operation of a sense amplifier can be ensured while an increase in the storage capacity is being achieved.

(6) An advantageous effect can be obtained in that in addition to the above, the word lines are configured as a hierarchical structure comprising a main word lines and sub-word lines divided into plural form in the direction in which the main word lines extend, the complementary bit lines are divided into plural form in their extending direction, sub-word drivers are provided in association with the divided sub-word lines, the sense amplifier array is provided in association with the divided complementary bit lines, the sub-word lines are assigned to the main word lines in plural form, and each of the sub-word drivers selects one of the plurality of sub-word lines according to a signal for each main word line and a signal for each sub-word selection line, whereby the amount of signals necessary for the sense operation of each sense amplifier can be ensured while an increase in the storage capacity is being achieved.

(7) An advantageous effect can be obtained in that in addition to the above, a voltage corresponding to an intermediate voltage of the operating voltage for the sense amplifier is supplied to the common electrodes through power supply lines formed in mesh form inclusive of a portion above each memory array in which the dynamic memory cells are formed, whereby complementary noise developed in the plate electrodes can be canceled out more effectively.

(8) An advantageous effect can be obtained in that in addition to the above, a first metal wiring layer corresponding to the top layer formed so as to extend in a first direction, and a second metal wiring layer formed below the top layer formed so as to extend in a second direction orthogonal to the first direction are used for the mesh-like power supply lines to thereby make it possible to form the power supply lines without being restricted by other wires.

(9) An advantageous effect can be obtained in that in a dynamic RAM comprising a plurality of word lines respectively connected to address select terminals of a plurality of dynamic memory cells, a plurality of complementary bit line pairs respectively connected to input/output terminals of the plurality of dynamic memory cells and placed in directions opposite to one another, and a sense amplifier array which is supplied with an operating voltage according to an operation timing signal and comprises a plurality of latch circuits for respectively amplifying the differences in voltage between the complementary bit line pairs, common electrodes provided in opposing relationship to storage nodes corresponding to connecting points between address select MOSFETs and information storage capacitors of the plurality of dynamic memory cells provided on both sides with the sense amplifier array as the center are connected to one another while circuit connections in the sense amplifier array are being ensured by wiring means using the same material as the common electrodes, thereby making it possible to cancel out and thereby greatly reduce complementary noise developed in two plate electrodes provided with the sense amplifier array interposed therebetween.

(10) An advantageous effect can be obtained in that in a dynamic RAM comprising a plurality of word lines respectively connected to address select terminals of a plurality of dynamic memory cells, a plurality of complementary bit line pairs respectively connected to input/output terminals of the plurality of dynamic memory cells and placed in directions opposite to one another, and a sense amplifier array which is supplied with an operating voltage according to an operation timing signal and comprises a plurality of latch circuits for respectively amplifying the differences in voltage between the complementary bit line pairs, common electrodes provided in opposing relationship to storage nodes corresponding to connecting points between address select MOSFETs and information storage capacitors of the plurality of dynamic memory cells provided on both sides with the sense amplifier array as the center are connected to one another while circuit connections in the sense amplifier array are being ensured by wiring means formed in the same process step as the common electrodes, thereby making it possible to cancel out and thereby greatly reduce complementary noise developed in two plate electrodes provided with the sense amplifier array interposed therebetween.

(11) An advantageous effect can be obtained in that in a dynamic RAM comprising a plurality of word lines respectively connected to address select terminals of a plurality of dynamic memory cells, a plurality of complementary bit line pairs respectively connected to input/output terminals of the plurality of dynamic memory cells and placed in directions opposite to one another, and a sense amplifier array which is supplied with an operating voltage according to an operation timing signal and comprises a plurality of latch circuits for respectively amplifying the differences in voltage between the complementary bit line pairs, common electrodes provided in opposing relationship to storage nodes corresponding to connecting points between address select MOSFETs and information storage capacitors of the plurality of dynamic memory cells provided on both sides with the sense amplifier array as the center are connected to one another while circuit connections in the sense amplifier array are being ensured by wiring means formed with the same layer as the common electrodes, thereby making it possible to cancel out and thereby greatly reduce complementary noise developed in two plate electrodes provided with the sense amplifier array interposed therebetween.

(12) An advantageous effect can be obtained in that in an open bit line type dynamic RAM comprising a plurality of word lines respectively connected to address select terminals of a plurality of dynamic memory cells, a plurality of complementary bit line pairs respectively connected to input/output terminals of the plurality of dynamic memory cells and placed in directions opposite to one another, and a sense amplifier array which is supplied with an operating voltage according to an operation timing signal and comprises a plurality of latch circuits for respectively amplifying the differences in voltage between the complementary bit line pairs, power supply lines are provided in mesh form inclusive of a portion above each memory array in which the dynamic memory cells are formed, thereby reducing noise developed in each plate electrode supplied via each power supply line with a voltage corresponding thereto, a substrate and selection and non-selection levels of each word line, whereby an operating margin for one-intersection DRAM array can greatly be increased while high integration by the one-intersection DRAM array is being exploited.

(13) An advantageous effect can be obtained in that in addition to the above, the word lines are configured as a hierarchical structure comprising main word lines and sub-word lines divided into plural form in the direction in which the main word lines extend, the complementary bit lines are divided into plural form in their extending direction, sub-word drivers are provided in association with the divided sub-word lines, the sense amplifier array is provided in association with the divided complementary bit lines, the sub-word lines are assigned to the main word lines in plural form, and the sub-word driver selects one of the plurality of sub-word lines according to a signal for each main word line and a signal for each sub-word selection line, whereby the amount of signals necessary for the sense operation of each sense amplifier can be ensured while an increase in the storage capacity is being achieved.

(14) An advantageous effect can be obtained in that in addition to the above, each of the power supply line is configured so as to supply an operating voltage corresponding to the non-selection level of the sub-word line to the sub-word driver, whereby the sub-word line can be prevented from floating, and the time required to hold information by each memory cell can be ensured.

(15) An advantageous effect can be obtained in that in addition to the above, each of the power supply lines is configured so as to supply an operating voltage corresponding to the selection level of the sub-word line to the sub-word driver, whereby the selection level of each sub-word line can be ensured and the full writing of information charge into each memory cell can be ensured, thereby making it possible to ensure an information holding time as a result thereof.

(16) An advantageous effect can be obtained in that in addition to the above, each of the power supply lines is set to a predetermined voltage supplied to each of the common electrodes provided in opposing relationship to the storage nodes for the storage capacitors, thereby making it possible to cancel out complementary noise developed in the two plate electrodes provided with the sense amplifier array interposed therebetween.

(17) An advantageous effect can be obtained in that in addition to the above, each of the power supply lines is configured so as to supply a substrate bias voltage to a semiconductor region in which the address selection MOSFETs of the dynamic RAM are formed, thereby making it possible to stabilize a substrate voltage and reduce noise placed on each bit line or the like through a capacitance parasitic on the substrate.

The invention, which has been made by the present inventors, has been described above specifically by the embodiments. However, the invention of the present application is not necessarily limited to the embodiments. It is needless to say that various changes can be made thereto within the scope not departing from the its substance. For example, a substrate (P type well) itself on which a pair of sub arrays provided with a sense amplifier array interposed therebetween is formed, is used to form such a slit structure that wires suitably penetrate the sense amplifier array, and they may be interconnected with one another by a semiconductor region related to it. An input/output interface of a dynamic RAM is not limited to the above-described DDR SDRAM. Various embodiments such as an SDRAM, etc. can be adopted. The present invention can be widely used in an open bit line type dynamic RAM and a semiconductor device.

Advantageous effects obtained by a typical one of the inventions disclosed in the present application will be described briefly as follows: In a dynamic RAM comprising a plurality of word lines respectively connected to address select terminals of a plurality of dynamic memory cells, a plurality of complementary bit line pairs respectively connected to input/output terminals of the plurality of dynamic memory cells and placed in directions opposite to one another, and a sense amplifier array which is supplied with an operating voltage according to an operation timing signal and comprises a plurality of latch circuits for respectively amplifying the differences in voltage between the complementary bit line pairs, common electrodes provided in opposing relationship to storage nodes corresponding to connecting points between address select MOSFETs and information storage capacitors of the plurality of dynamic memory cells provided on both sides with the sense amplifier array as the center are connected to one another while circuit connections in the sense amplifier array are being ensured by wiring means using the common electrodes, thereby making it possible to cancel out and hence greatly reduce complementary noise developed in two plate electrodes provided with the sense amplifier array interposed therebetween.

What is claimed is:

1. A dynamic RAM, comprising:
    a plurality of dynamic memory cells each comprising a MOSFET and a capacitor, said MOSFET having a gate set as a select terminal, one source and drain set as input/output terminals, and the other source and drain connected to storage nodes of the capacitor;
    a plurality of word lines respectively connected to the select terminals of the plurality of dynamic memory cells;
    a plurality of complementary bit line pairs respectively connected to the input/output terminals of the plurality of dynamic memory cells and placed so as to extend in directions opposite to one another with one ends thereof as the centers; and
    a sense amplifier array which is placed on the one-end side of said complementary bit line pairs and respectively amplifies differences in voltage between said complementary bit lines; and
    wherein common electrodes provided, so as to be opposed to the storage nodes of the capacitors of said plurality of dynamic memory cells, on both sides of said sense amplifier array are connected to one another by wiring means using the same.

2. The dynamic RAM according to claim 1, wherein said dynamic memory cells have storage capacitors formed above the bit lines.

3. The dynamic RAM according to claim 1 or 2, wherein said each capacitor takes such a cylinder form that one electrode thereof is formed on an inner wall of a hole defined in an interlayer dielectric.

4. The dynamic RAM according to a claim 1 or 2, wherein said each common electrode is formed of a laminated film obtained by stacking tungsten on ruthenium or TiN.

5. The dynamic RAM according to a claim 1 or 2, further including,
    complementary input/output lines extended along the sense amplifier array; and
    wherein said sense amplifier array includes,
    a precharge circuit which supplies an intermediate voltage of a voltage for activating said each sense amplifier to said complementary bit line pair, and
    switch MOSFETs each of which receives a Y select signal at a gate thereof and is provided between the complementary bit line pairs and the complementary input/output lines.

6. The dynamic RAM according to a claim 1 or 2, wherein said word lines comprise main word lines and sub-word lines divided into plural form in the direction in which the main word lines extend,
    sub-word drivers are provided so as to correspond to the divided sub-word lines,
    said sub-word lines are assigned to said each main word line in plural form, and
    said each sub-word driver selects one of the plurality of sub-word lines in response to a signal on the main word line and a signal on a sub-word select line.

7. The dynamic RAM according to claim 6, wherein said common electrode is supplied with a bias voltage corresponding to an intermediate voltage of a voltage for activating each of latch circuits in the sense amplifier array through power supply lines formed in mesh form inclusive of a portion above a memory array in which the dynamic memory cells are formed.

8. The dynamic RAM according to claim 7, wherein said mesh-like power supply lines comprise a first metal wiring layer corresponding to a top layer, which is formed so as to extend in a first direction, and a second metal wiring layer formed below the top layer, which is formed so as to extend in a second direction orthogonal to the first direction.

9. A dynamic RAM, comprising:

first and second memory mats respectively comprising a plurality of dynamic memory cells each comprising a MOSFET and a capacitor, said MOSFET having a gate set as a select terminal, one source and drain set as input/output terminals, and the other source and drain connected to storage nodes of the capacitor, a plurality of word lines respectively connected to the select terminals of the plurality of dynamic memory cells, and a plurality of complementary bit line pairs respectively connected to the input/output terminals of the plurality of dynamic memory cells;

a sense amplifier array comprising a plurality of latch circuits which respectively amplify differences in voltage between the complementary bit line pairs of the first and second memory mats placed so as to extend in directions opposite to each other from each pair of input/output terminals;

first electrodes provided so as to correspond to the storage nodes of capacitors in the first memory mat;

second electrodes provided so as to correspond to the storage nodes of capacitors in the second memory mat; and connecting portions which are formed of the same material as the first and second electrodes and interconnect the first and second electrodes with the sense amplifier array interposed therebetween.

10. A dynamic RAM, comprising:

first and second memory mats respectively comprising a plurality of dynamic memory cells each comprising a MOSFET and a capacitor, said MOSFET having a gate set as a select terminal, one of source and drain set as input/output terminals, and the other of source and drain connected to storage nodes of the capacitor, a plurality of word lines respectively connected to the select terminals of the plurality of dynamic memory cells, and a plurality of complementary bit line pairs respectively connected to the input/output terminals of the plurality of dynamic memory cells;

a sense amplifier array comprising a plurality of latch circuits which respectively amplify differences in voltage between the complementary bit line pairs of the first and second memory mats placed so as to extend in directions opposite to each other from each pair of input/output terminals;

first electrodes provided so as to correspond to the storage nodes of capacitors in the first memory mat;

second electrodes provided so as to correspond to the storage nodes of capacitors in the second memory mat; and connecting portions which are formed in the same process step as the first and second electrodes and interconnect the first and second electrodes with the sense amplifier array interposed therebetween.

11. A dynamic RAM, comprising:

first and second memory mats respectively comprising a plurality of dynamic memory cells each comprising a MOSFET and a capacitor, said MOSFET having a gate set as a select terminal, one source and drain set as input/output terminals, and the other source and drain connected to storage nodes of the capacitor, a plurality of word lines respectively connected to the select terminals of the plurality of dynamic memory cells, and a plurality of complementary bit line pairs respectively connected to the input/output terminals of the plurality of dynamic memory cells;

a sense amplifier array comprising a plurality of latch circuits which respectively amplify differences in voltage between the complementary bit line pairs of the first and second memory mats placed so as to extend in directions opposite to each other from each pair of input/output terminals;

first electrodes provided so as to correspond to the storage nodes of capacitors in the first memory mat;

second electrodes provided so as to correspond to the storage nodes of capacitors in the second memory mat; and connecting portions which are formed in the same layer as the first and second electrodes and interconnect the first and second electrodes with the sense amplifier array interposed therebetween.

12. A dynamic RAM, comprising:

a plurality of dynamic memory cells each comprising a MOSFET and a capacitor, said MOSFET having a gate set as a select terminal, one source and drain set as input/output terminals, and the other source and drain connected to storage nodes of the capacitor;

a plurality of word lines respectively connected to the select terminals of the plurality of dynamic memory cells;

a plurality of complementary bit line pairs respectively connected to the input/output terminals of the plurality of dynamic memory cells; and a sense amplifier array comprising a plurality of latch circuits which respectively amplify differences in voltage between the complementary bit line pairs placed so as to extend in directions opposite to each other from each pair of input/output terminals; and wherein power supply lines are provided in mesh form inclusive of a portion above a memory array in which the dynamic memory cells are formed.

13. The dynamic RAM according to claim 12, wherein said word lines comprise main word lines and sub-word lines divided into plural form in the direction in which the main word lines extend, sub-word drivers are provided so as to correspond to the divided sub-word lines, said sub-word lines are assigned to said each main word line in plural form, and said each sub-word driver selects one of the plurality of sub-word lines in response to a signal on the main word line and a signal on a sub-word select line.

14. The dynamic RAM according to claim 12, further including word drivers connected to the plurality of word lines, and wherein said each power supply line supplies an operating voltage corresponding to a non-selection level of said each word line to said word driver.

15. The dynamic RAM according to claim 12, further including word drivers connected to the plurality of word lines, and wherein said each power supply line supplies an operating voltage corresponding to a selection level of said each word line to said word driver.

16. The dynamic RAM according to claim 12, wherein said each power supply line supplies a voltage to be applied to each of common electrodes provided in association with the storage nodes of the capacitors.

17. The dynamic RAM according to claim 12, wherein said each power supply line supplies. a substrate bias voltage to a semiconductor region on which MOSFETs constituting the dynamic memory cells are formed.

18. A semiconductor device, comprising:

a first memory mat including a plurality of first bit lines, a plurality of first word lines, and a plurality of first memory cells respectively connected to the plurality of first bit lines and the plurality of first word lines;

a second memory mat including a plurality of second bit lines, a plurality of second word lines, and a plurality of second memory cells respectively connected to points where the plurality of second bit lines and the plurality of second word lines intersect; and a plurality of sense amplifiers formed in a region between said first memory mat and said second memory mat; and wherein each of said plurality of sense amplifiers is connected to a corresponding one of the plurality of first bit lines and a corresponding one of the plurality of second bit lines, each of the plurality of first memory cells includes a first capacitor having first and second electrodes, and a first transistor having a gate coupled to a corresponding one of the plurality of first word lines and a source to drain path whose one is coupled to a corresponding one of the plurality of first bit lines and whose other is connected to the first electrode of the first capacitor, each of the plurality of second memory cells includes a second capacitor having third and fourth electrodes, and a second transistor having a gate coupled to a corresponding one of the plurality of second word lines and a source to drain path whose one is coupled to a corresponding one of the plurality of second bit lines and whose other is coupled to the third electrode of the second capacitor, and the second electrodes of the first capacitors of the plurality of first memory cells, and the fourth electrodes of the second capacitors of the plurality of second memory cells are respectively coupled to one conductive layer placed on the first memory mat, the second memory mat and the plurality of sense amplifiers.

19. A semiconductor device, comprising:

a first memory mat including a plurality of first bit lines, a plurality of first word lines, and a plurality of first memory cells respectively connected to the plurality of first bit lines and the plurality of first word lines;

a second memory mat including a plurality of second bit lines, a plurality of second word lines, and a plurality of second memory cells respectively connected to points where the plurality of second bit lines and the plurality of second word lines intersect; and a plurality of sense amplifiers formed in a region between said first memory mat and said second memory mat; and wherein each of said plurality of sense amplifiers is connected to a corresponding one of the plurality of first bit lines and a corresponding one of the plurality of second bit lines, each of the plurality of first memory cells includes a first capacitor having first and second electrodes, and a first transistor having a gate coupled to a corresponding one of the plurality of first word lines and a source to drain path whose one is coupled to a corresponding one of the plurality of first bit lines and whose other is connected to the first electrode of the first capacitor, each of the plurality of second memory cells includes a second capacitor having third and fourth electrodes, and a second transistor having a gate coupled to a corresponding one of the plurality of second word lines and a source to drain path whose one is coupled to a corresponding one of the plurality of second bit lines and whose other is coupled to the third electrode of the second capacitor, the second electrodes of the first capacitors of the plurality of first memory cells are respectively coupled to a first conductive layer placed on the plurality of first memory cells, the fourth electrodes of the second capacitors of the plurality of second memory cells are respectively coupled to a second conductive layer placed on the plurality of second memory cells, and the first conductive layer and the second conductive layer are coupled to each other by connecting portions formed of the same material as the first conductive layer and the second conductive layer and placed on the plurality of sense amplifiers.

20. A semiconductor device, comprising:

a first memory mat including a plurality of first bit lines, a plurality of first word lines, and a plurality of first memory cells respectively connected to the plurality of first bit lines and the plurality of first word lines;

a second memory mat including a plurality of second bit lines, a plurality of second word lines, and a plurality of second memory cells respectively connected to points where the plurality of second bit lines and the plurality of second word lines intersect; and a plurality of sense amplifiers formed in a region between said first memory mat and said second memory mat;

wherein each of said plurality of sense amplifiers is connected to a corresponding one of the plurality of first bit lines and a corresponding one of the plurality of second bit lines, each of the plurality of first memory cells includes a first capacitor having first and second electrodes, and a first transistor having a gate coupled to a corresponding one of the plurality of first word lines and a source to drain path whose one is coupled to a corresponding one of the plurality of first bit lines and whose other is connected to the first electrode of the first capacitor, and each of the plurality of second memory cells includes a second capacitor having third and fourth electrodes, and a second transistor having a gate coupled to a corresponding one of the plurality of second word lines and a source to drain path whose one is coupled to a corresponding one of the plurality of second bit lines and whose other is coupled to the fourth electrode of the second capacitor;

a plurality of first voltage wires which are formed in a first layer on the first memory mat, the second memory mat and the sense amplifiers and extend in a first direction; and a plurality of second voltage wires which are formed in a second layer on the first layer, extend in a second direction different from the first direction, and are respectively coupled to the plurality of first voltage wires by a portion for connecting between the first layer and the second layer.

* * * * *